United States Patent
Borra et al.

(10) Patent No.: US 10,967,463 B2
(45) Date of Patent: Apr. 6, 2021

(54) SN WHISKER GROWTH MITIGATION USING NIO SUBLAYERS

(71) Applicant: The University of Toledo, Toledo, OH (US)

(72) Inventors: Vamsi Borra, Toledo, OH (US); Daniel G. Georgiev, Toledo, OH (US); Srikanth Itapu, Toledo, OH (US)

(73) Assignee: The University of Toledo, Toledo, OH (US)

(*) Notice: Subject to any disclaimer, the term of this patent is extended or adjusted under 35 U.S.C. 154(b) by 0 days.

(21) Appl. No.: 16/381,445

(22) Filed: Apr. 11, 2019

(65) Prior Publication Data

US 2019/0314937 A1 Oct. 17, 2019

Related U.S. Application Data

(60) Provisional application No. 62/656,062, filed on Apr. 11, 2018.

(51) Int. Cl.
*H01L 23/50* (2006.01)
*B23K 35/26* (2006.01)
(Continued)

(52) U.S. Cl.
CPC .......... *B23K 35/262* (2013.01); *B23K 1/0016* (2013.01); *H01L 23/50* (2013.01);
(Continued)

(58) Field of Classification Search
CPC ....... C23C 30/00; B23K 35/262; H01L 23/14; H01L 23/50; C01G 53/04
(Continued)

(56) References Cited

U.S. PATENT DOCUMENTS 4,886,712 A * 12/1989 Azzerri ................... C25D 5/48
428/632
5,302,434 A * 4/1994 Doerner .................. G11B 5/72
428/831
(Continued)

OTHER PUBLICATIONS

Irwin et al., p-Type semiconducting nickel oxide as an efficiency-enhancing anode interfacial layer in polymer bulk-heterojunction solar cells, Feb. 26, 2008, The Acadamy of Sciences of the USA, vol. 105 No. 8, URL: <https://www.ncbi.nlm.nih.gov/pmc/articles/PMC2268537/pdf/zpq2783.pdf>, pp. 2783-2787 (Year: 2008).*
(Continued)

*Primary Examiner* — Humera N. Sheikh
*Assistant Examiner* — Katherine A Christy
(74) *Attorney, Agent, or Firm* — MacMillan, Sobanski & Todd, LLC

(57) ABSTRACT

Semiconductor layers useable for minimizing or preventing the growth of metal whiskers, as well as devices and methods utilizing the same and kits for making the same, are described. The semiconductor layers may be nickel oxide layers. In some embodiments, an electronic device may include a substrate, a first metal layer on the substrate, a semiconductor layer comprising NiO on the first metal layer, and a second metal layer on the semiconductor layer. In some embodiments, an electronic device may include a substrate, a semiconductor layer comprising NiO directly on the substrate, and a metal layer directly on the semiconductor layer. A method for making an electronic device may include depositing a semiconductor layer comprising NiO on a substrate, and depositing a metal layer on the semiconductor layer, where the semiconductor layer substantially prevents the growth of whiskers on the metal layer.

26 Claims, 17 Drawing Sheets
(7 of 17 Drawing Sheet(s) Filed in Color)

(51) Int. Cl.
*B23K 1/00* (2006.01)
*H05K 1/09* (2006.01)
*B23K 101/42* (2006.01)
*B23K 103/00* (2006.01)
*B23K 101/40* (2006.01)
*H05K 3/16* (2006.01)
*H05K 3/14* (2006.01)

(52) U.S. Cl.
CPC ............ *H05K 1/09* (2013.01); *B23K 2101/40* (2018.08); *B23K 2101/42* (2018.08); *B23K 2103/56* (2018.08); *H05K 3/146* (2013.01); *H05K 3/16* (2013.01); *H05K 2201/0317* (2013.01); *H05K 2201/0326* (2013.01); *H05K 2201/0338* (2013.01); *H05K 2201/0391* (2013.01); *H05K 2201/0769* (2013.01)

(58) Field of Classification Search
USPC ........................................................ 428/469
See application file for complete search history.

(56) References Cited

U.S. PATENT DOCUMENTS

| | | | | |
|---|---|---|---|---|
| 5,728,285 | A * | 3/1998 | Mathew | ............ H01L 23/49582 |
| | | | | 205/122 |
| 5,849,422 | A * | 12/1998 | Hayashi | ................. B82Y 10/00 |
| | | | | 428/611 |
| 6,583,500 | B1 * | 6/2003 | Abbott | .............. H01L 23/49582 |
| | | | | 257/666 |
| 2001/0049027 | A1 * | 12/2001 | Endo | ....................... B32B 15/01 |
| | | | | 428/607 |
| 2003/0146497 | A1 * | 8/2003 | Abbott | .................... H01L 24/48 |
| | | | | 257/666 |
| 2006/0267051 | A1 * | 11/2006 | Gstrein | ................. G01N 27/129 |
| | | | | 257/253 |
| 2011/0109591 | A1 * | 5/2011 | Kurokawa | .......... G02F 1/13338 |
| | | | | 345/175 |
| 2012/0305882 | A1 * | 12/2012 | Gu | .......................... H01L 45/06 |
| | | | | 257/4 |
| 2013/0089181 | A1 | 4/2013 | Hoffman et al. | |
| 2014/0318609 | A1 * | 10/2014 | Martorell Pena | ... H01L 51/4213 |
| | | | | 136/255 |
| 2014/0370328 | A1 | 12/2014 | Chu et al. | |
| 2015/0155224 | A1 * | 6/2015 | Koyama | ............... H01L 23/481 |
| | | | | 257/774 |
| 2017/0263541 | A1 | 9/2017 | Dutta | |

OTHER PUBLICATIONS

Shamieh, Electronics: Doping Semiconductors, Dec. 23, 2016, Dummies, URL: <https://web.archive.org/web/20161223064632/https://www.dummies.com/programming/electronics/electronics-doping-semiconductors/>, pp. 1-3 (Year: 2016).*

Islam et al., "Investigation of the Changes in Electronic Properties of Nickel Oxide (NiOx) Due to UV/Ozone Treatment," Apr. 27, 2017, American Chemical Society, URL: <https://pubs.acs.org/doi/pdf/10.1021/acsami.7b01629>, pp. 17201-17207 (Year: 2017).*

Xu et al., "Understanding Whisker Phenomenon: Driving Force for Whisker Formation", (2002), slides 1-54.

* cited by examiner

PRIOR ART FIG. 1A

SN WHISKER GROWTH MITIGATION USING NIO SUBLAYERS

RELATED APPLICATIONS

This application claims priority to U.S. Provisional Application No. 62/656,062 filed under 35 U.S.C. § 111(b) on Apr. 11, 2018, the disclosure of which is incorporated herein by reference in its entirety.

STATEMENT REGARDING FEDERALLY SPONSORED RESEARCH

This invention was made with no government support. The government has no rights in this invention.

BACKGROUND

Metals commonly used in electronics manufacturing, such as tin and zinc, as well as related alloys, often show electrically conductive hair-like crystalline structures on their surfaces, referred to as whiskers. Whiskers can lead to current leakage and short circuits in sensitive electronic equipment, causing significant losses and, in some cases, catastrophic failures in industries such as the automotive and aerospace industries. There is a need in the art for new and improved methods for mitigating or eliminating whisker-related failure.

SUMMARY

Provided is an electronic device comprising a substrate, a first metal layer on the substrate, a semiconductor layer comprising NiO on the first metal layer, and a second metal layer on the semiconductor layer. In certain embodiments, the semiconductor layer is a uniform, continuous layer. In certain embodiments, the semiconductor layer fully covers a surface of the first metal layer.

In certain embodiments, the semiconductor layer consists essentially of NiO. In certain embodiments, the semiconductor layer has a thickness ranging from about 20 nm to about 500 nm. In certain embodiments, the semiconductor layer has a thickness ranging from about 50 nm to about 200 nm. In certain embodiments, the semiconductor layer has a thickness of about 100 nm.

In certain embodiments, the first or second metal layer comprises Sn. In certain embodiments, the first or second metal layer comprises Cu. In certain embodiments, the first or second metal layer comprises Zn. In certain embodiments, the first or second metal layer comprises Cd, Al, Au, or Ag.

In certain embodiments, the second metal layer is substantially free of whiskers. In certain embodiments, the electronic device is a printed circuit board or an integrated circuit. In certain embodiments, the substrate comprises glass, silicon, or plastic. In certain embodiments, the second metal layer is directly on the NiO layer. In certain embodiments, the semiconductor layer is directly on the first metal layer, and the first metal layer is not Ni. In certain embodiments, the NiO comprises a dopant.

Further provided is an electronic device comprising a substrate, a semiconductor layer comprising NiO directly on the substrate, and a metal layer directly on the semiconductor layer. In certain embodiments, the semiconductor layer is a uniform, continuous layer. In certain embodiments, the semiconductor layer fully covers a surface of the substrate. In certain embodiments, the semiconductor layer consists essentially of NiO. In certain embodiments, the NiO layer has a thickness ranging from about 20 nm to about 500 nm. In certain embodiments, the NiO layer has a thickness ranging from about 50 nm to about 200 nm. In certain embodiments, the NiO layer has a thickness of about 100 nm.

In certain embodiments, the metal layer comprises Sn, Cu, Zn, Cd, Al, Au, or Ag. In certain embodiments, the substrate comprises glass, silicon, or plastic. In certain embodiments, the electronic device is a printed circuit board or an integrated circuit. In certain embodiments, the NiO comprises a dopant.

Further provided is a method for making an electronic device, the method comprising depositing a semiconductor layer comprising NiO on a substrate, and depositing a metal layer on the semiconductor layer, where the semiconductor layer substantially prevents the growth of whiskers on the metal layer. In certain embodiments, the metal layer comprises Sn, Cu, Zn, Cd, Al, Au, or Ag. In certain embodiments, the substrate comprises glass, silicon, or plastic.

Further provided is a kit comprising a first container housing a solder comprising Sn, and a second container housing a source of nickel and a solution.

BRIEF DESCRIPTION OF THE DRAWINGS

The patent or application file may contain one or more drawings executed in color and/or one or more photographs. Copies of this patent or patent application publication with color drawing(s) and/or photograph(s) will be provided by the U.S. Patent and Trademark Office upon request and payment of the necessary fees.

FIGS. 1A-1B: Schematic layout of a normal sample (FIG. 1A) and a sample with a NiO underlayer (FIG. 1B).

FIG. 7E shows a lower magnification image of a Class-3 whisker on the control sample after 1 year of incubation. FIG. 7F shows the longest whisker on the control sample.

DETAILED DESCRIPTION

Figure 1B:
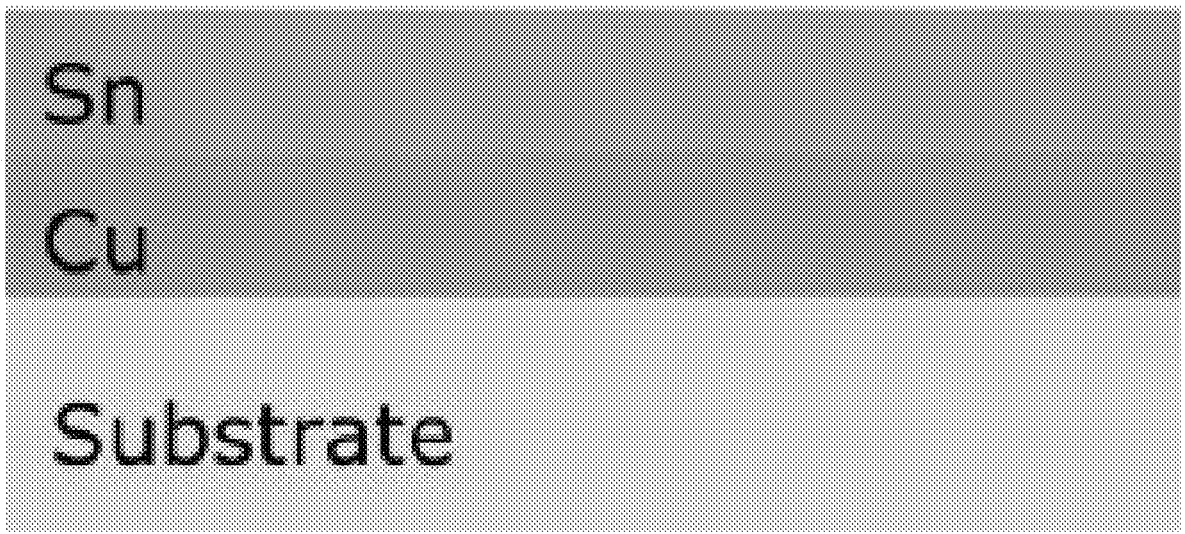
Figure 1B:
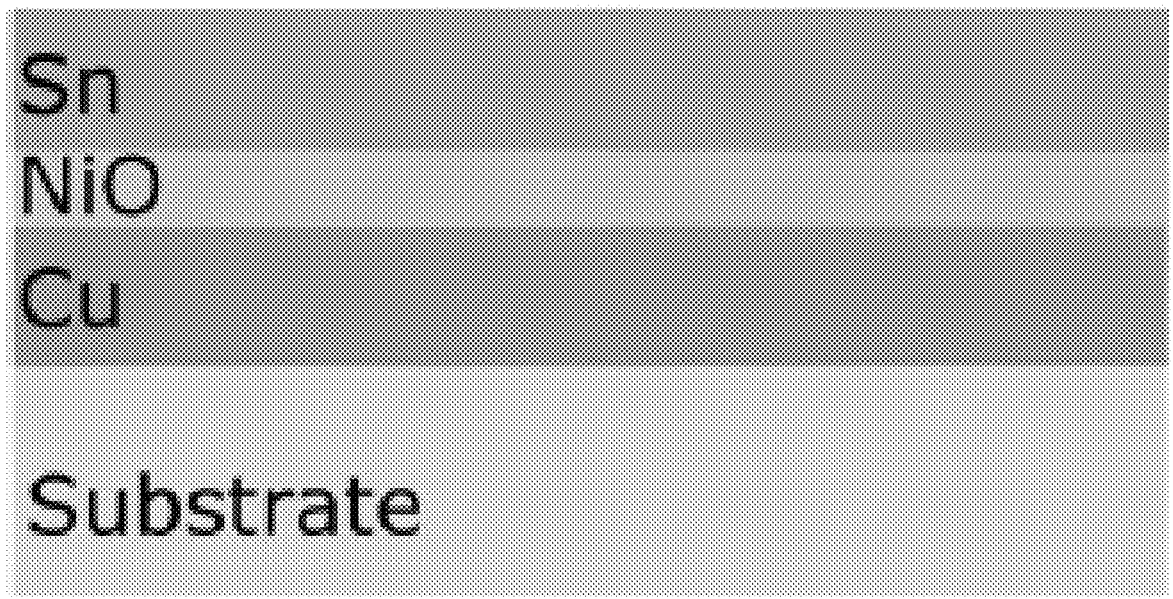

Throughout this disclosure, various publications, patents, and published patent specifications are referenced by an identifying citation. The disclosures of these publications, patents, and published patent specifications are hereby incorporated by reference into the present disclosure in their entirety to more fully describe the state of the art to which this invention pertains.

In accordance with the present disclosure, the growth of whiskers of metals such as Sn, Zn, Cu, Cd, Au, or Ag can be mitigated by using a thin semiconductor underlayer. Data from experimental observations show a total suppression of whisker growth over a period of more than a year. This method can be used as a better alternative to other methods for Sn whisker growth suppression such as those based on Ni underlayers or conformal polymer coatings.

Sn-based solders that are extensively used in electronic manufacturing often develop electrically conductive hair-like structures on their surfaces, which are referred to as metal whiskers (MWs). These whiskers form in a rather unpredictable fashion and can have lengths ranging from a few micrometers to several millimeters. MWs can lead to current leakage and short circuits in electronic equipment causing significant losses in the automotive, airspace, and other industries. Other metals and metal alloys, such as Zn, In, Al, Au, Ag, Cd, and Pb are also known to form whiskers. Although whiskers were discovered almost 70 years ago, the basic mechanism of their formation is not well understood. The dominant view today appears to be that MWs' formation is due to stress relieving phenomena, but there are other hypotheses as well, including one referred to as electrostatic theory. The latter provides some quantitative estimates of MW nucleation and growth rates, and their statistical distributions, which are found to be consistent with observations. Electrostatic theory proposes that imperfections on metal surfaces can result in small patches of net positive or negative electric charge, leading to the formation of a local electric field(E) which is mostly normal to the surface and can cause the growth of whiskers.

Various techniques for fabrication of Sn and other metal coatings, combined with post-deposition treatment, have been studied as methods for whisker growth mitigation. For example, adding a small fraction of Pb (2-3%) is known to significantly suppress whiskers formation. Even though this approach does not entirely eliminate the problem, it works well and has been widely used in the industry over the last several decades. Unfortunately, recently introduced laws and standards (such as RoHS and others) require the elimination or the significant reduction of the use of Pb, and this has exacerbated the problem of whiskers growth, while a consistent and universal solution is still elusive.

As a more specific example, using a Ni sublayer between a Cu substrate and a Sn layer to mitigate whiskers has shown potential in whiskers growth mitigation. However, other research data show that the Ni sublayer was able to prevent whisker growth only for 6 months. Others have reported the growth of whiskers even with a Ni underlying layer within a relatively short duration of 2000 hrs. The reliability of the Ni sublayer approach was further questioned by the fact that whiskers were found on multilayer ceramic chip capacitors and connectors by several other research groups. Although the Ni sublayer does not guarantee the elimination or even any substantial suppression of whiskers growth, many electronics manufacturers still use Ni as a sublayer.

Ni sublayers have indeed shown some effect on whiskers growth when compared with the Sn-coatings without a sublayer. Theoretical work indicates that the Ni sublayer in the Cu—Ni—Sn system reduces the initial stress between the interfaces and also hinders the formation of intermetallic compounds (IMCs). However, these theories fail to explain why whiskers eventually still form when a Ni sublayer is used.

In the examples herein, Ni was replaced with nickel oxide (NiO) as a sublayer for the purpose of mitigating whisker growth. NiO is typically a p-type semiconductor and is used or studied for light emission applications, electrochromic devices, as a material for resistive random access memory (RRAM) devices, and also in contact electrodes for perovskite based solar cells. NiO can be deposited, for example, by pulsed laser deposition (PLD), chemical vapor deposition (CVD), sol-gel processes, dip coating, or sputtering. Coating of a uniform NiO layer with reasonably good crystallinity on an industrial scale can be easily accomplished by the sol-gel method, such as by alkaline hydrolysis of nickel hydroxide. Furthermore, at temperatures above 400° C., nickel powder reacts with oxygen to form NiO. For example, a mixture of nickel powder and water can be heated to 1000° C. to yield NiO. Hydroxides, nitrates, and carbonates of nickel can also be pyrolyzed to yield NiO.

Thus, provided herein are electronic devices, such as the electronic device depicted in FIG. 1B. An electronic device in accordance with the present disclosure includes a substrate, a first metal layer on the substrate, a semiconductor layer comprising NiO on the first metal layer, and a second metal layer on the semiconductor layer. In such devices, the NiO may be directly on the first metal layer, where the first metal layer is not Ni. In other embodiments, the electron device comprises a substrate, a semiconductor layer comprising NiO on the substrate, and a metal layer on the NiO layer. The semiconductor layer comprising NiO in such devices can have a thickness ranging from about 20 nm to about 500 nm, or from about 50 nm to about 200 nm. In some non-limiting examples, the semiconductor layer comprising NiO has a thickness of about 100 nm, about 200 nm, about 300 nm, or about 400 nm. In general, the thicker the semiconductor layer comprising NiO, the more resistance may be added to the metal layer on top of the semiconductor layer comprising NiO. Therefore, it is desirable to minimize the thickness of the semiconductor layer comprising NiO while still preventing or hindering whisker growth.

The semiconductor layer comprising NiO may consist essentially of NiO. The semiconductor layer comprising NiO may also be doped, with either n-type dopants or p-type dopants, as desired. However, it is understood that doping of the semiconductor layer comprising NiO may result in less than optimal whisker prevention. Suitable methods of doping NiO are known in the art and encompassed within the present disclosure. As manufactured through some methods such as sputtering, NiO is intrinsically p-type.

In some embodiments, the semiconductor layer comprising NiO is a uniform, continuous film of NiO. Without wishing to be bound by theory, it is believed that a layer of accidentally oxidized nickel would not have the same anti-whisker effects because it would not provide uniform and continuous coverage of the metal. Rather, when nickel is oxidized unintentionally, it creates islands of nickel oxide instead of a uniform, continuous film, and such islands leave areas of an adjacent metal layer exposed where whisker growth may still occur. Furthermore, accidentally oxidized nickel would likely not result in stoichiometric NiO.

Suitable substrates include, but are not limited to, glass, silicon, or plastic. However, any material useable in electronic devices may serve as the substrate. The metal in the metal layers can be in the form of an elemental metal or a metal alloy. Non-limiting example metals include Sn, Zn, Cu, Cd, Al, Au, and Ag. However, any metal can be used, although not at all metals have whisker growth problems. Moreover, the metal layers can be of any suitable thickness for the desired electronic device. The electronic device can be, for example, a printed circuit board or an integrated circuit. The approach described herein can be used with any type of electronic device in which metal whisker growth is possible.

The devices and methods described herein can be used to prevent shorts in an electronic board and avoid sparks in packaged electronic components. Furthermore, the devices and methods can lead to the development of other whisker mitigating strategies and predictions for the formation of metal whiskers referred in electrostatic theory.

It is envisioned that the devices and methods described herein could be embodied as parts of a kit or kits. A non-limiting example of such a kit is a kit for making an electronic device, the kit comprising a solder comprising a metal such as Sn, and a source of nickel and a solution, in separate containers. Alternatively, the kit may comprise a circuit board, a solder comprising Sn, and a source of nickel in separate containers, where the containers may or may not be present in a combined configuration. Many other kits are possible, such as kits further comprising one or more reagents for depositing a NiO layer. The kits may further include instructions for using the components of the kit to practice the subject methods. The instructions for practicing the subject methods are generally recorded on a suitable recording medium. For example, the instructions may be present in the kits as a package insert or in the labeling of the container of the kit or components thereof. In other embodiments, the instructions are present as an electronic storage data file present on a suitable computer readable storage medium, such as a flash drive. In other embodiments, the actual instructions are not present in the kit, but means for obtaining the instructions from a remote source, such as via the internet, are provided. An example of this embodiment is a kit that includes a web address where the instructions can be viewed and/or from which the instructions can be downloaded. As with the instructions, this means for obtaining the instructions is recorded on a suitable substrate.

Example 1

The ability of NiO sublayers for whisker growth mitigation has been examined. A thin NiO film was applied on a Cu-coated substrate before the deposition of a thicker Sn layer. The growth of Sn whiskers was then followed by optical and scanning electron microscopy and was compared with the whisker growth on a control sample without the NiO sublayer. No whiskers were observed on the sample with the NiO layer even after 12 months, whereas the control sample developed whiskers of size and density that would be generally expected.

Experimental Details

Two types of samples were examined. In the first type, Sn was deposited on a Cu-coated substrate without a sublayer between Sn and Cu. The samples in this category are referred to as control samples. In the second type, NiO was deposited onto Cu-coated substrates and then Sn was deposited on top of the NiO layer. These samples are referred to as NiO sublayer (NSL) samples. In both cases, Cu was used as an under-layer to simulate the Sn coatings in the electronic parts that are either made of Cu or contain Cu conducting tracks (such as in PCB board, etc.).

Multiple cleaning steps were used for the substrates. The cleaning procedure was as follows: wash in cleaning solution (Micro-90), then thoroughly rinse with DI water, followed by ultra-sonication bath in methanol for 20-25 min, and, finally, ultra-sonication bath in ethanol for 20-25 min. In between these steps, the surfaces were rubbed with a lint-free wipe and blown dry with nitrogen.

A 200 nm (±10 nm) thick Cu layer was coated by vacuum evaporation of 99.999% pure Cu on clean substrates simultaneously. Several Cu-coated samples from this group are designated as NSL samples and the others are designated as control samples. The NiO layer was then deposited on the NSL samples by reactive radio frequency magnetron sputtering of a 99.99% pure-Ni target in a 20:80 oxygen to argon partial pressure to a thickness of 100 nm. Finally, a 250 nm (±40 nm) Sn layer was deposited on NSL and control samples simultaneously by vacuum evaporation of 99.999% pure Sn. The evaporation steps of Cu and Sn were carried out in a Denton Vacuum machine (model DV-502A) at a base vacuum of $(3.5-4.8) \times 10^{-6}$ Pa. The NiO deposition was done in a Torr International sputtering machine (model 2G2-TH2).

Results and Discussion

Figure 2:
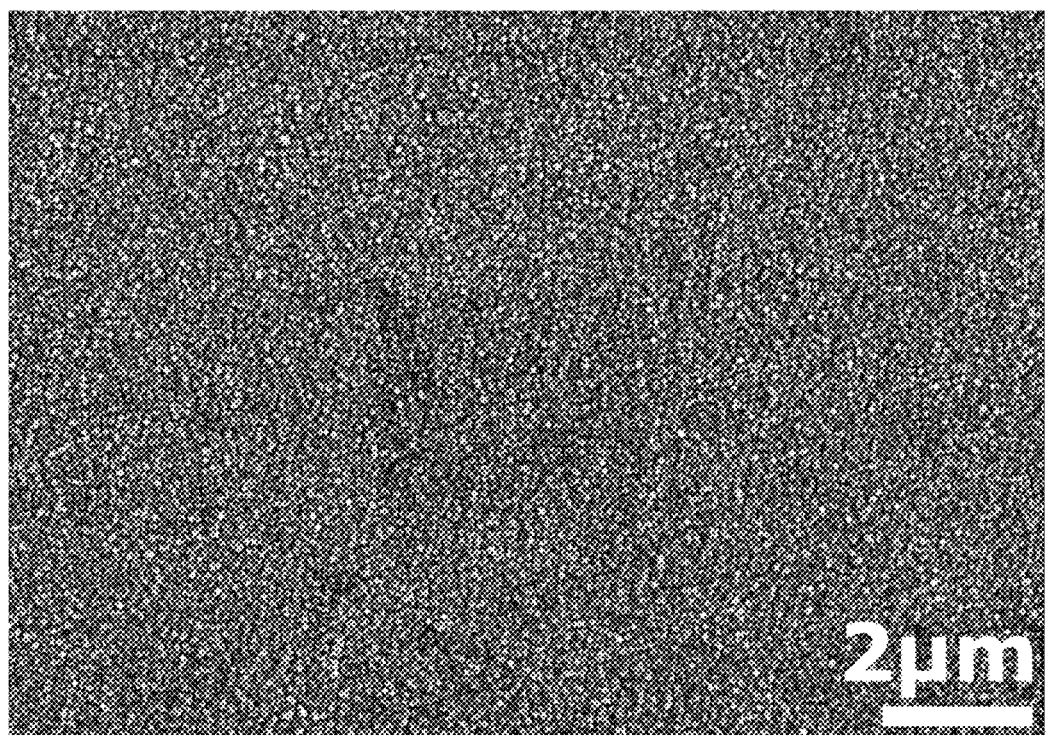
FIG. 2: SEM image showing a NiO sublayer on Cu before the deposition of Sn.

An SEM image of a NiO sublayer (top view) deposited on the Cu layer is shown in FIG. 2. It indicates a high-quality continuous film growth.

The surface morphology of the samples was examined by scanning electron microscopy (SEM) in a Hitachi S-4800 machine, operated in secondary-electrons mode with acceleration voltage of 5 kV. Compositional analysis was performed using an Oxford Instruments' energy dispersive X-ray spectrograph (EDS), installed in the SEM system. The EDS software (INCA) was calibrated using cobalt EDS standards prior to the EDS point & I.D. mapping. I-V measurements between different layers were performed using Keithley 4200 semiconductor parameter characterization setup. The formation of any intermetallic compounds (IMC) and the thickness of the layers in the control and NSL samples were verified by imaging of cross-section samples obtained by focused ion beam (FIB) milling using a Ga source in a FEI Quanta 3D FEG machine.

The samples' surface evolution was followed by periodic SEM imaging of the control and NSL samples. The whisker density (whiskers/mm$^2$) calculated over the course of 12 months is summarized in Table 1 below.

TABLE 1

Summary of whisker density (in mm$^{-2}$) in control and NSL sample

| Sample type | 2 weeks | | | 6 Months | | | 12 Months | | |
|---|---|---|---|---|---|---|---|---|---|
| | Class-1 | Class-2 | Class-3 | Class-1 | Class-2 | Class-3 | Class-1 | Class-2 | Class-3 |
| Control sample | 0 | 0 | 0 | 1848 ± 84 | 0 | 0 | 1673 ± 113 | 1215 ± 98 | 607 ± 66 |
| NSL sample | 0 | 0 | 0 | 0 | 0 | 0 | 0 | 0 | 0 |

Figure 3:
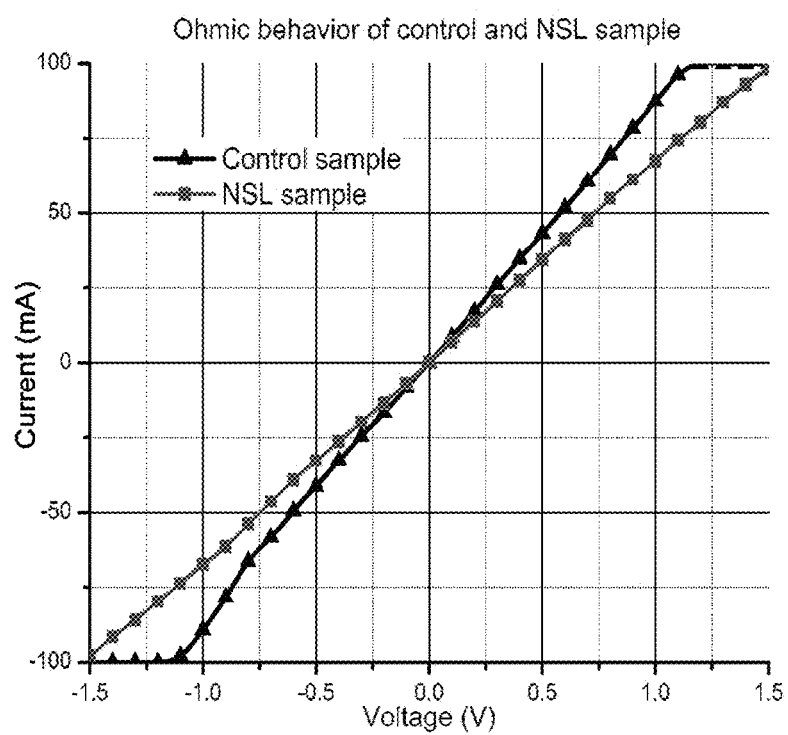
FIG. 3: I-V curves from the control and NSL samples.
Figure 4A:
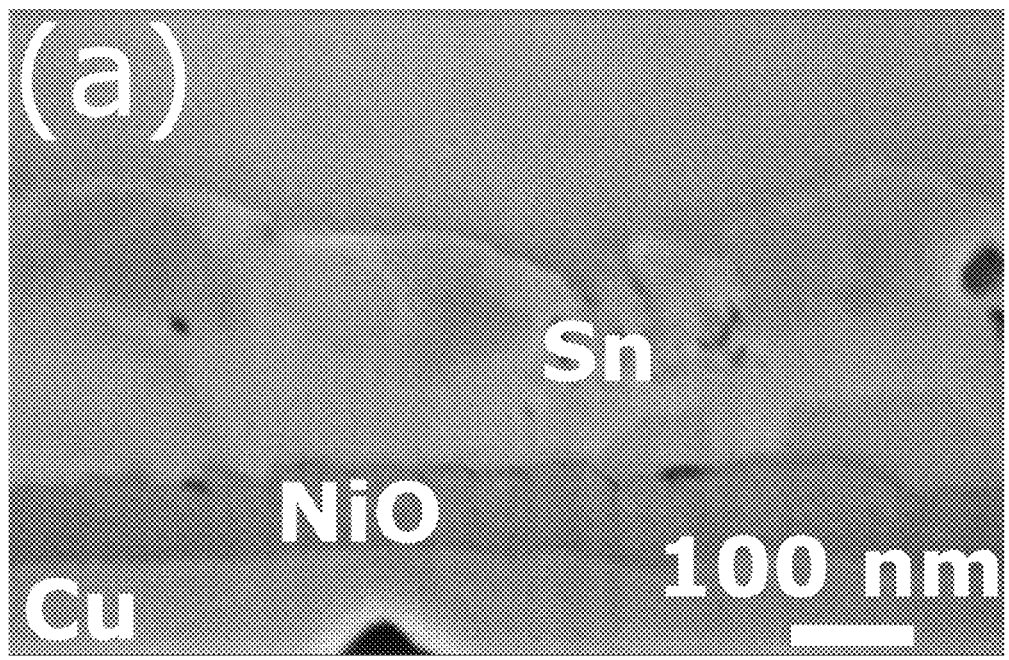
FIGS. 4A-4B: SEM images showing the cross-section of an NSL sample (FIG. 4A) and a control sample (FIG. 4B) performed using FIB technique.
Figure 4B:
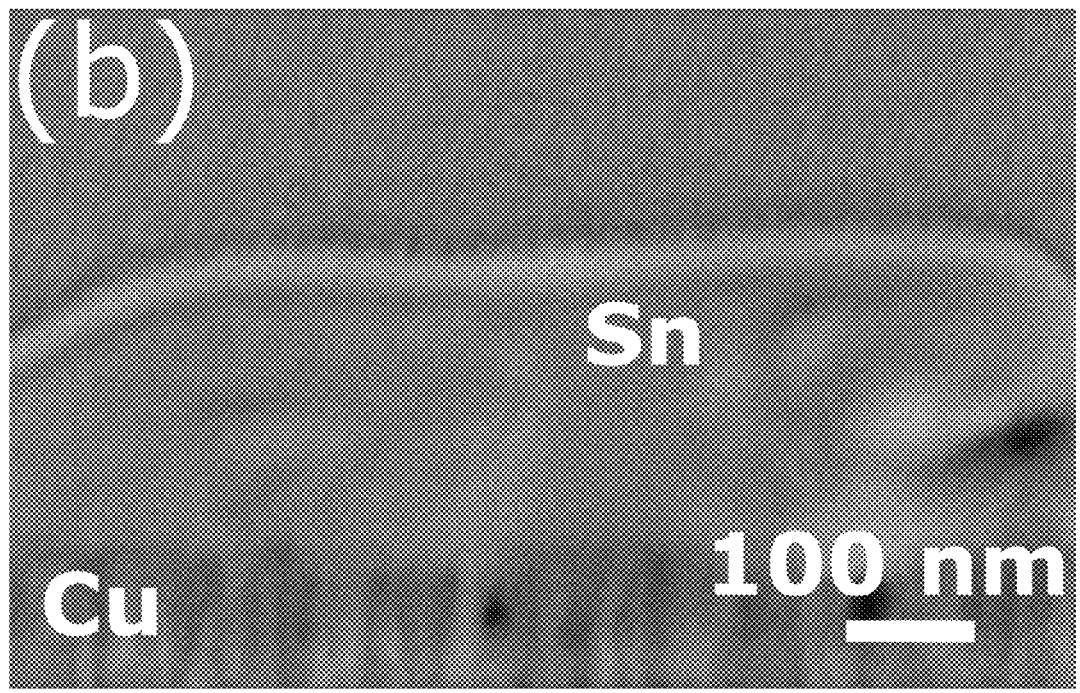

The I-V curves, shown in FIG. 3, are obtained from two-probe measurements (one probe connected to the top Sn layer surface and the other to the Cu-coated substrate) done on both the control and the NSL samples. These I-V curves are reasonably linear and show good ohmic contacts and behavior in both cases. Since the resulting resistance value of the NSL sample (15.0 mΩ) is very close to the control sample's resistance value (11.3 mΩ), these measurements confirms that the NiO layer did not introduce any significant additional resistance between the Cu and the Sn layers. The NSL sample's cross-section (obtained by FIB milling) was examined over a stretch of more than 20 mm using multiple high-resolution SEM images. FIG. 4A shows a typical and representative NSL sample cross-section. It confirms that a uniform and continuous NiO sublayer between Cu and Sn was obtained. Additionally, a similar cross-sectional analysis was performed on the control sample (see FIG. 4B) to verify the consistency (of Sn film) and identify any alloy formation between the Cu and Sn. Upon examining Cu—Sn interface also over a stretch of more than 20 μm, no evidence of alloys that formed between Cu and Sn over the entire control sample was found, although whiskers have grown right above this region. Also, no features between the layers that can be identified as intermetallic compounds (IMCs) were observed. The formation of IMCs is often considered solely responsible for, or at least contributing to, the whiskers growth, although there are contradicting observations on that point.

SEM imaging on control and NSL samples was performed immediately after the deposition to verify any initial whisker formation. SEM imaging was then conducted as a function of time, every 15 days or 30 days. Throughout this evaluation, whisker densities were determined by manually counting whiskers from images taken at random over ten equal areas (128 μm×90 μm). Whiskers can form with varying lengths and diameters. Whiskers that are short and thin are less likely to cause any failures in the electronic parts due to their size. Most of the whisker-related losses that have been identified are caused by the long whiskers. So, the whiskers have been classified based on their lengths. It was observed that Class-1 whiskers are more frequent compared to Class-2 and Class-3. Class-1 whiskers have a length of up to 2 μm. Class-2 whiskers have a length of between 2 μm and 5 μm. Class-3 whiskers have a length of greater than 5 μm.

Figure 5A:
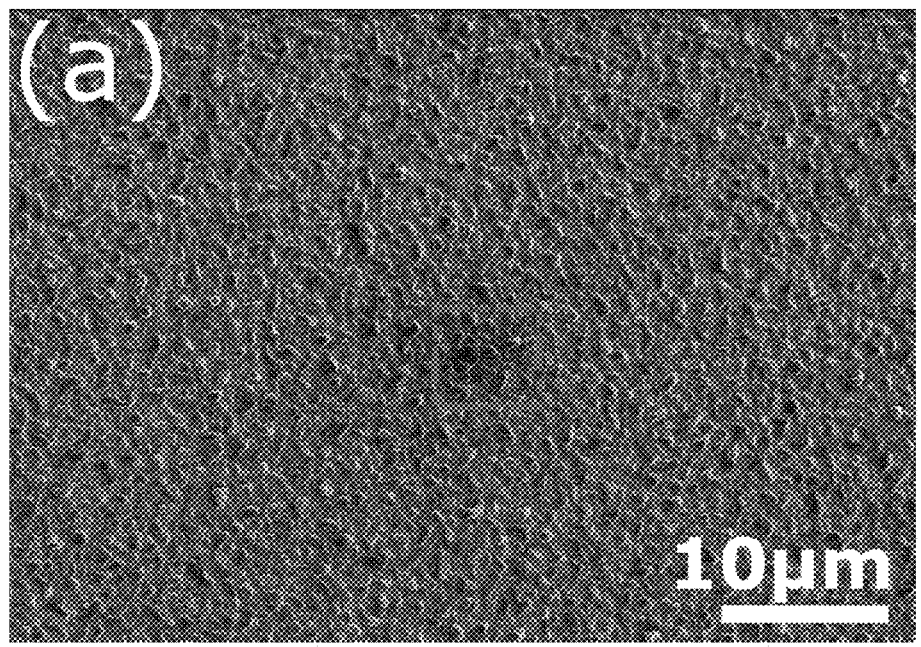
FIGS. 5A-5B: SEM images showing no whiskers observed on the control (FIG. 5A) or NSL (FIG. 5B) samples.
Figure 5B:
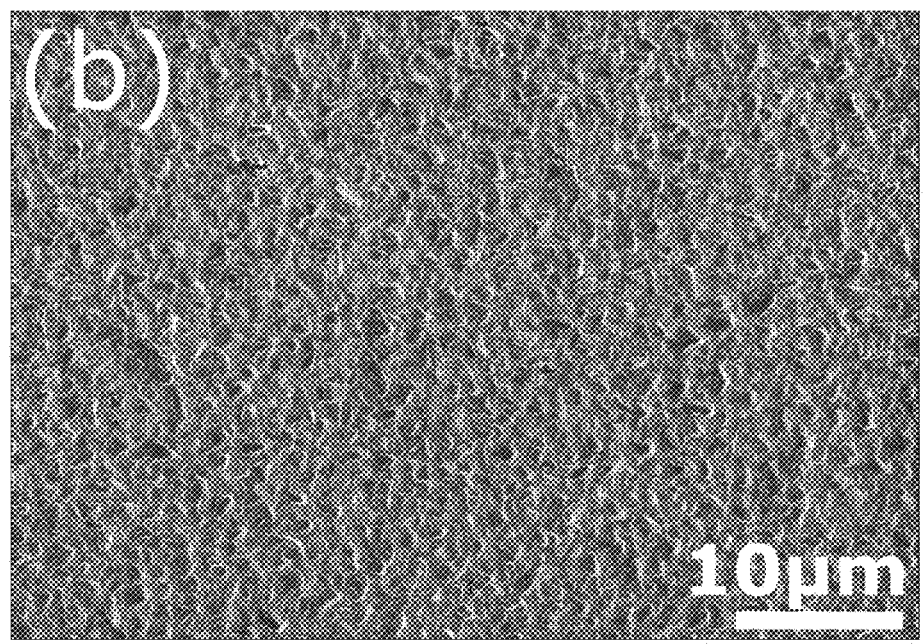
Figure 6A:
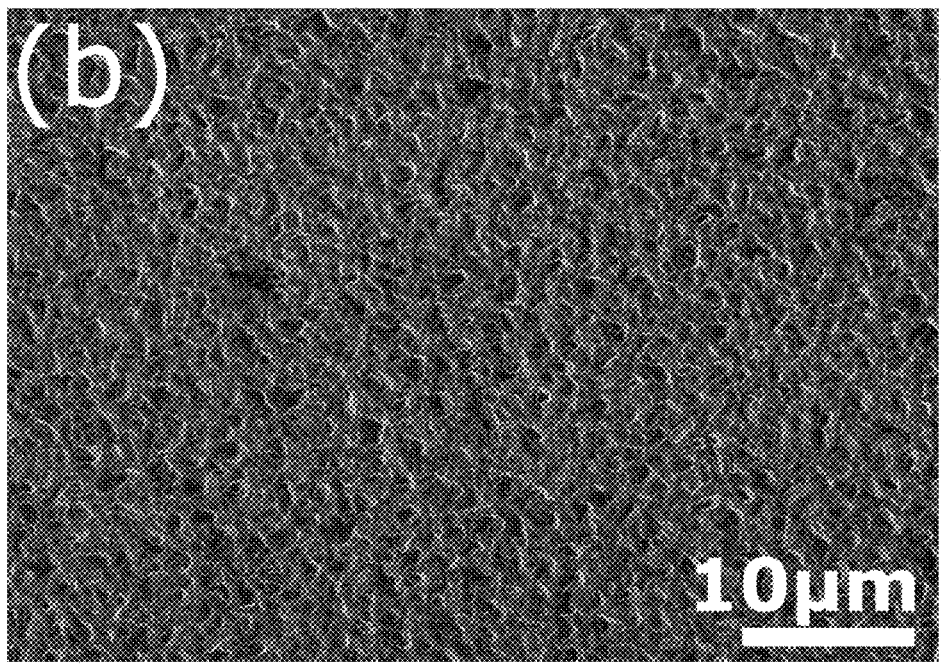
FIGS. 6A-6B: SEM images after four weeks showing Class-1 category whisker on the control sample (FIG. 6A), and no whiskers on the NSL sample (FIG. 6B).
Figure 6B:
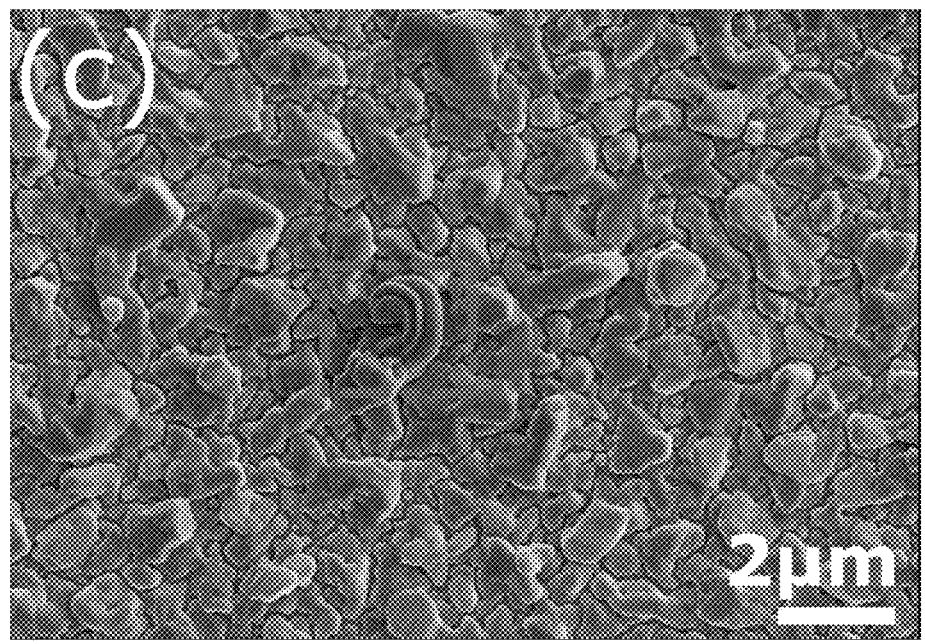

Immediately after the sample preparation, the SEM observations showed that there was no detectable whisker growth on either the control or the NSL samples, as can be seen in FIG. 5. About 4 weeks later, whiskers belonging to Class-1 were found on the control sample (FIG. 6A). No sign of any whisker growth was observed on the NSL sample (FIG. 6B).

It can be noted from Table 1 that there were only Class-1 whiskers during the first 6 months. As timed passed, some of the whiskers in Class-1 appear to have grown further to Class-2 and even Class-3 whiskers. In any event, the NSL sample did not exhibit any whiskers even after 12 months.

Figure 7A:
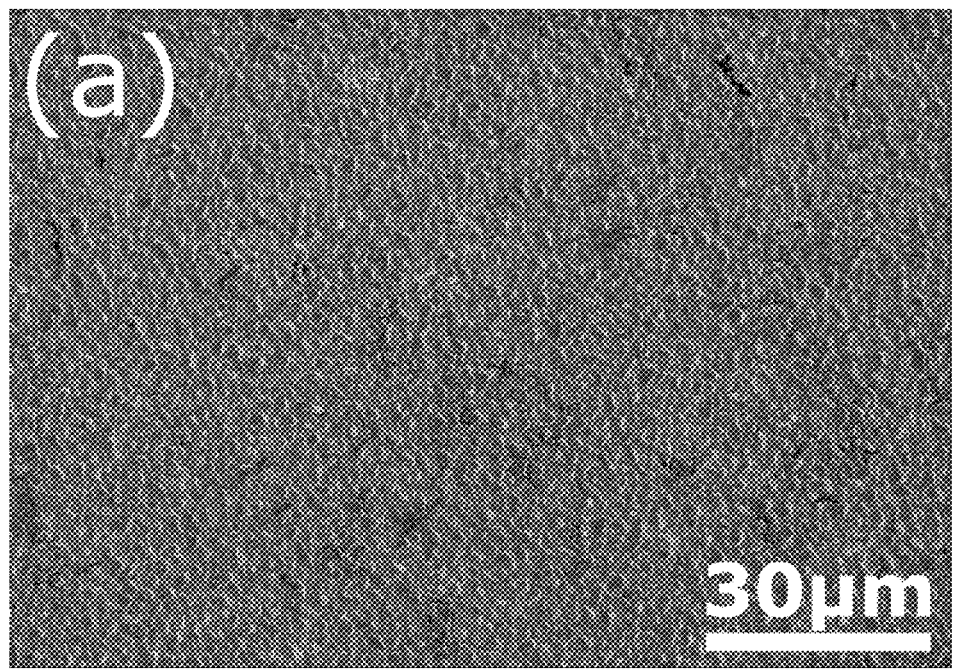
FIGS. 7A-7F: SEM images showing no sign of whiskers on NSL samples (FIGS. 7A-7B), and a dense whisker formation on the control sample (FIGS. 7C-7D), which corresponds to the density of ~3495±129 whiskers/$mm^2$.
Figure 7B:
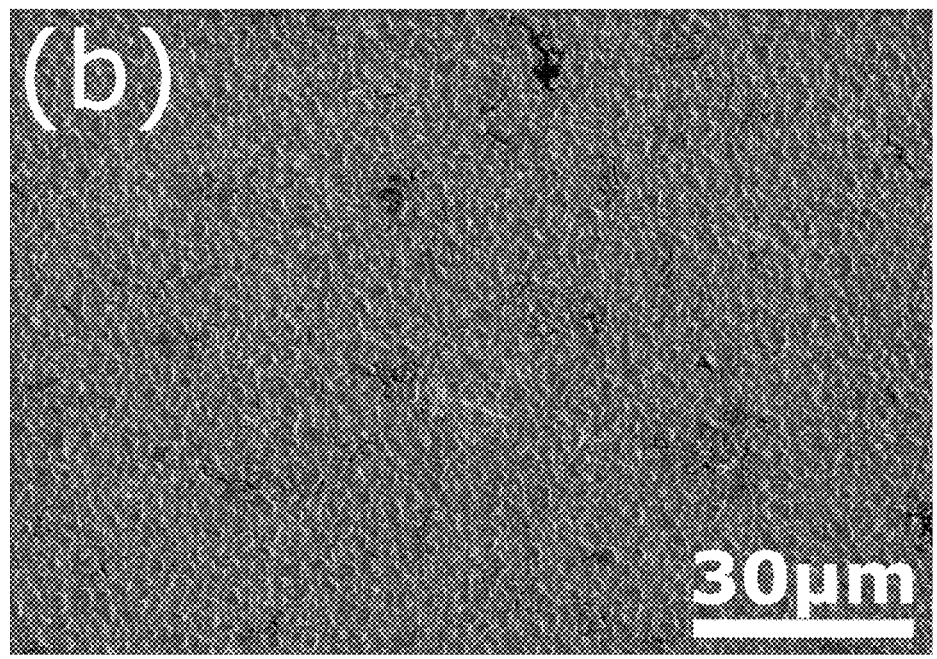
Figure 7C:
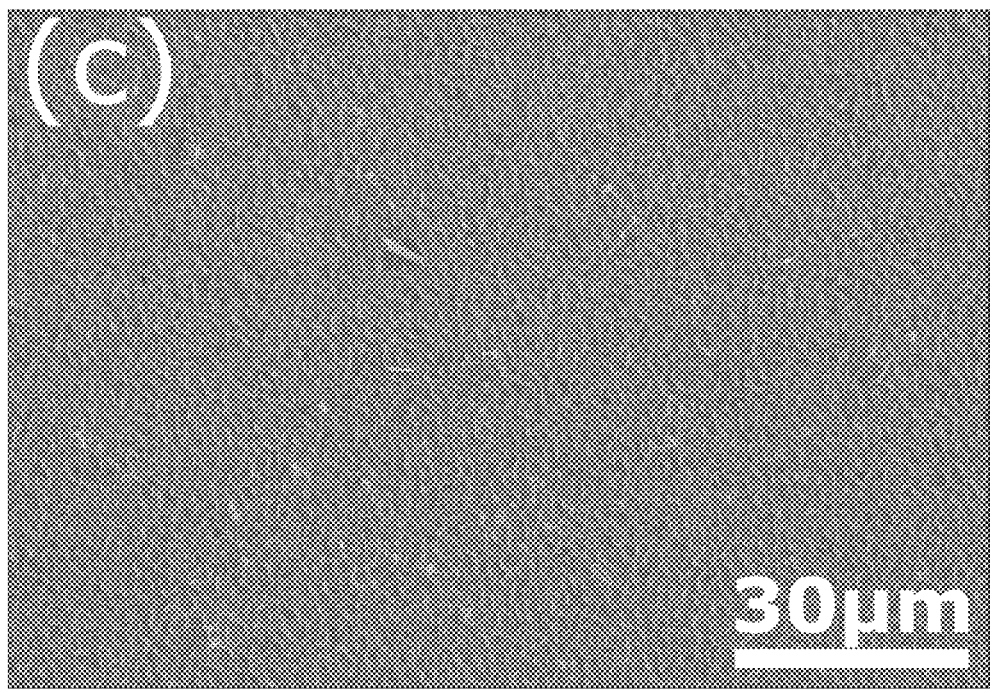
Figure 7D:
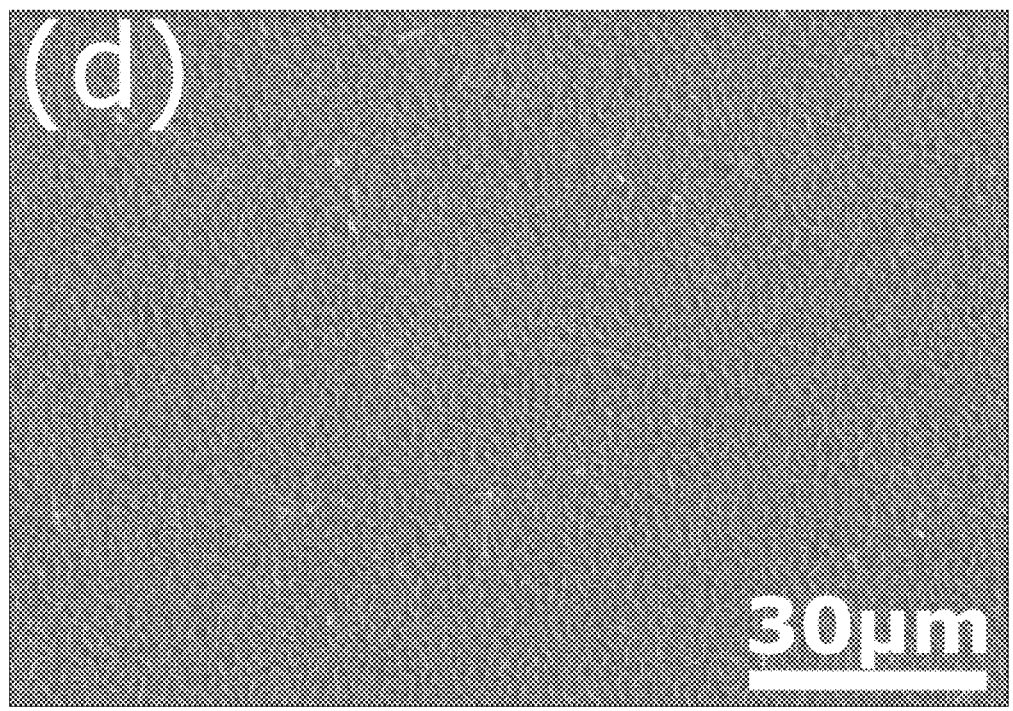
Figure 7E:
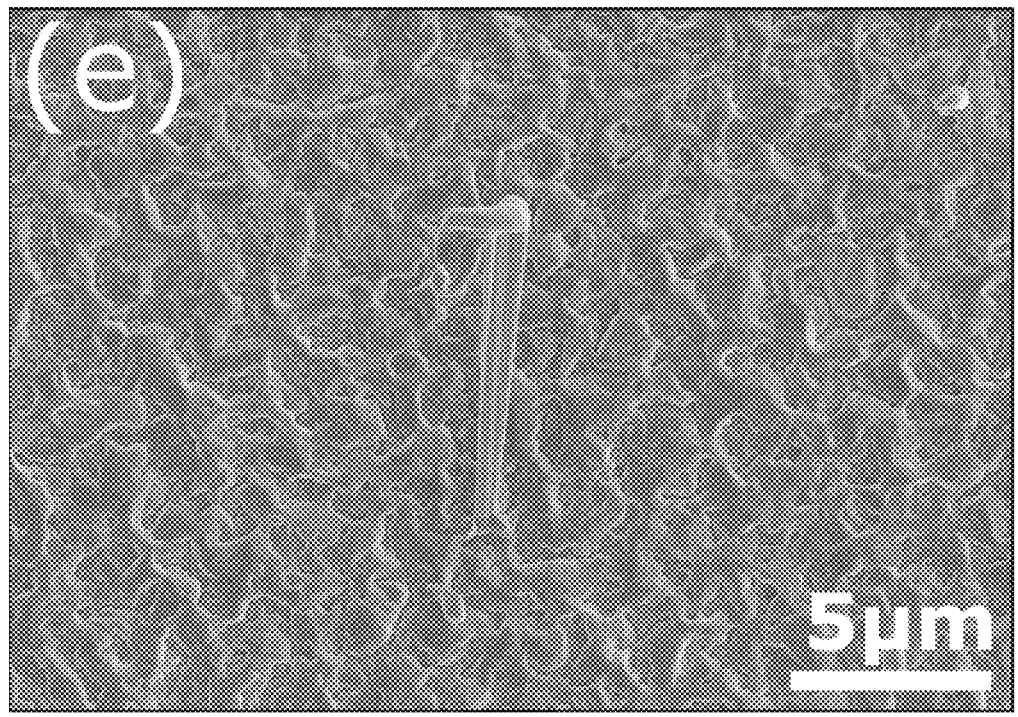
Figure 7F:
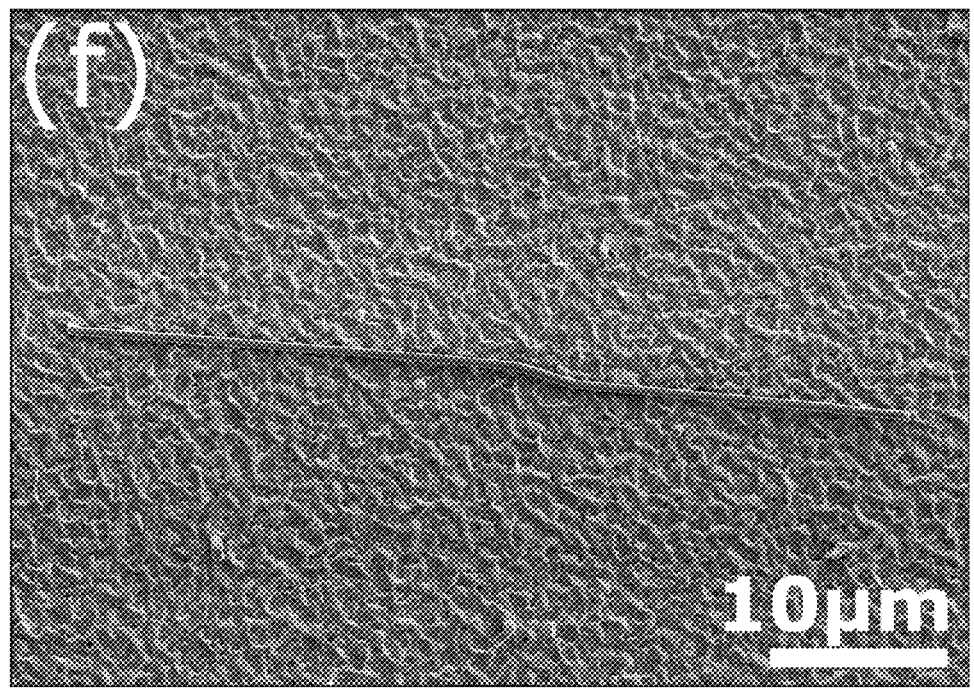
Figure 8:
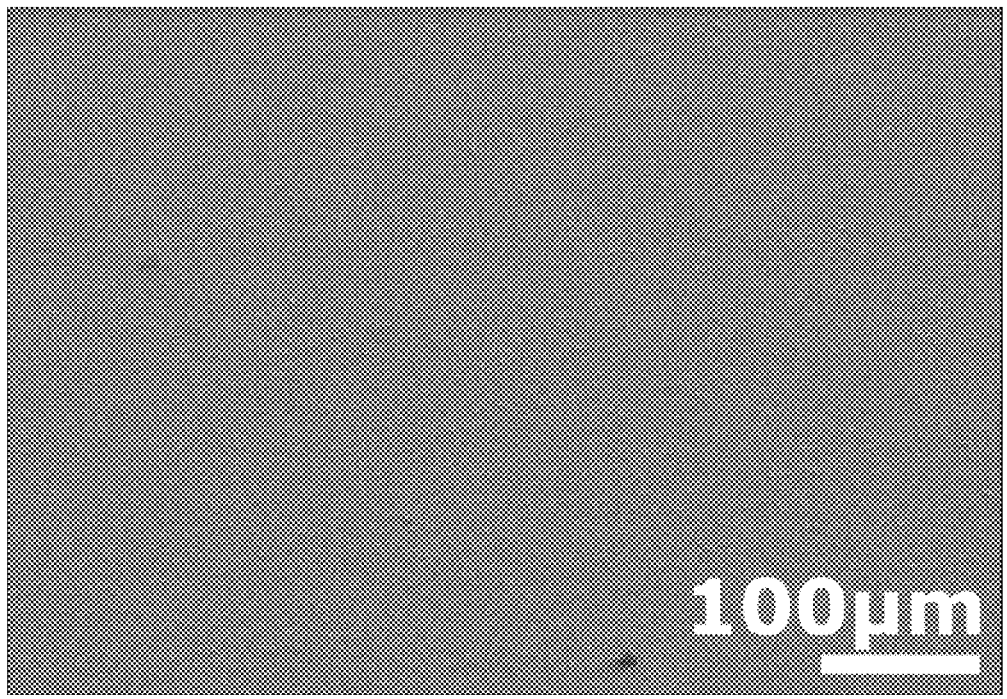
FIG. 8: SEM image showing a very large area scan of the control sample, a representative wide overview showing many whiskers (better seen under higher magnification, such as 800% zoom).

The SEM images in FIG. 7C and FIG. 7D illustrate whiskers that belong to different classes that have grown on the control sample. The overall whisker density on the control sample has a value close to 3495±129 (whiskers/mm$^2$), this includes all the 3 classes. A close-up view on one such whisker is shown in FIG. 7E, with a length close to 10 μm. During this evaluation, the longest whisker that was imaged on the control sample had a length close to 65 μm, and is shown in FIG. 7F. In contrast to the control sample, no signs of any whisker formation were observed on the NSL sample, shown in FIG. 7A and FIG. 7B. The large-area high-resolution SEM image in FIG. 8 illustrates whiskers with a wide range of lengths that have grown on the control sample over an area of ~0.25 mm$^2$.

It is not currently known why NiO sublayers essentially eliminate the growth of whiskers. Understanding the mechanism of whisker suppression by using a NiO sublayer, however, would be of significant interest as it may provide clues to what causes the whiskers growth in the first place. It may also allow the development of other methods for mitigation or elimination of whiskers growth. The existence of mechanical stress in the Sn film on Cu and a stress reduction in the case of the Sn/NiO/Cu combination is still a possible way to explain the observations in this example. IMC formation at the Sn/Cu interface and a resulting stress build-up is a commonly assumed mechanism of whiskers formation; however the FIB cross-sections work gave no evidence for IMCs formation in either case.

Another scenario, based on the electrostatic theory of whiskers growth is worth considering as well. The estimated value of the work function (ϕ) difference between Cu and Sn, for control sample, is calculated to be ~0.53 eV, which would result in a somewhat significant built-in electric field in the vicinity of the Sn/Cu interface. If this electric field is responsible for, or at least contributes to, the whiskers formation and growth, then the lack of a significant contact potential at the Sn/NiO interface could be the reason for whiskers suppression in the Sn/NiO/Cu case. The approximate work function difference between Sn and NiO, calculated from the electron affinity (χ) and band gap (assuming almost degenerate p-type NiO), can be ~0.4 eV or even less. A verification of these numbers would require precise knowledge not only of the values of the work functions but also the effect of any interface layers, contaminations, and impurities, as well as surface states. Still, a possible interpretation of these results may be developed in the frame of the electrostatic theory of whiskers.

In summary, it was observed that a NiO sublayer has a very strong impact on suppressing the whisker formation, and the NiO sublayer adds an almost negligible resistance to the Sn layer. This example shows that low-cost application methods of NiO, such as sol-gel or other solution based methods, may be utilized to have a significant effect in reducing or eliminating whisker growth.

Example 2

Sample Preparation

The glass substrates are pieces of microscope slide glass (Gold Seal) approximately 1 mm thick. The cleaning procedure was to place the fresh glass slides into a glass dish containing a solution of water and Micro-90 detergent. The glass dish was placed into an ultrasonic bath (Fisher, FS30H) for 20 minutes. Afterwards, the glass slides were dried with compressed air. This cycle of sonication and drying was repeated twice more; first using ethanol (95%, Decon) as a cleaning solution, and then using acetone (99.8%, Fisher).

Once the glass substrates were clean, a copper layer was deposited upon them via RF sputtering using the Torr International sputtering system (Model #2G2-TH2). In this process, the working gas was argon with a working pressure of 10 mTorr. The rf power applied to generate plasma was 110 W. At a rate of 0.8 Å/s, 300 nm thick copper films were deposited.

The deposition of nickel oxide was by dip coating. The solution was made with 5.1 g of nickel 2-ethylhexanoate (~15% Ni, American Elements) diluting with 2-propanol (99.9%, Fisher) to 30 mL. This created a 0.5 M solution upon mixing. The mixture was covered and stirred for 2 hours; ensuring complete dissolution of the solute. The final solution was transparent and green in color.

The dip coating process was carried out using the NIMA Dip Coater (NIMA DC Multi 8). The parameters were set using the computer connected to this device. The substrate-lowering speed was set to the maximum value of 280 mm/min. After reaching the lowest point, the substrate holder paused for 5 seconds. Then, the substrate was withdrawn from the solution at a rate of 1 mm/s. When the substrate was completely removed from the solution but still within the vapors of the solution contained within the beaker, the substrate holder was stopped for 5 minutes. Allowing the film to dry within the vapors of the solution helped prevent the layer from cracking when exposed to air.

The samples coated with nickel oxide were then placed in a furnace (MTI, Model #KSL-1100X) pre-heated to 100° C. At this temperature, the samples were dried for 10 minutes in air. Afterwards, these samples were calcined in the same furnace at 350° C. for 10 minutes.

Tin was deposited on the copper-covered glass and dip coated copper-covered glass samples by evaporation. In the Denton evaporator (Denton, Model #DV-502A), tin pellets were heated in a tungsten boat (Lesker, Part #EVS6005 W) to melt them. Using a current of 110 A, the deposition rate was 2.5 Å/s.

Film Thicknesses Measurements

The thickness of the sputtered films was measured during the deposition process. The thickness monitor displayed a value of 300 nm for the copper layers used in the samples. This value was also confirmed using cross-sectional SEM.

Figure 9:
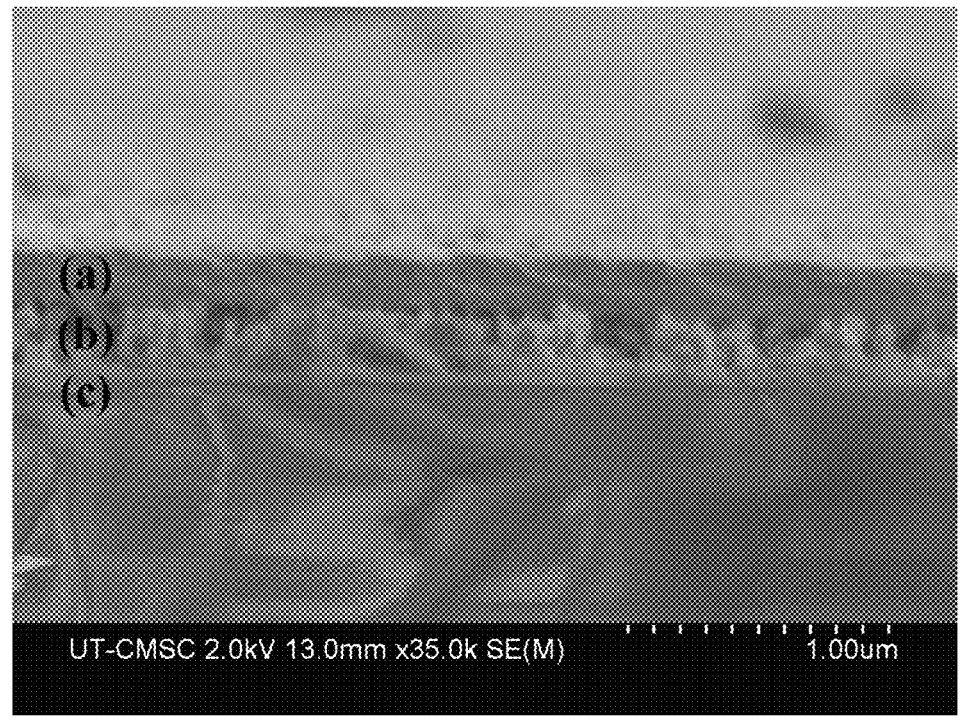
FIG. 9: Cross-sectional SEM image showing: (layer a) the nickel oxide layer prepared by successive dip coating (layer b) a sputtered copper film and (layer c) a glass slide substrate.

FIG. 9 is a cross-sectional SEM image showing: (layer a) the nickel oxide layer prepared by successive dip coating (layer b) a sputtered copper film and (layer c) a glass slide substrate.

The thickness of the dip coated layer was determined using cross-sectional SEM. The five-cycle dip coated layer was found to be roughly 300 nm thick. This corresponds to a single-cycle dip coating thickness of 60 nm. This value is the thickness of the dip coated nickel oxide film on a glass substrate with or without sputtered copper.

The thickness of the evaporated tin layers was measured during the deposition process. The thickness monitor displayed a value of 500 nm for the films used in the samples. This value is roughly equal across all samples.

Whisker Growth Examination

The long-term examination of whisker growth was carried out by SEM. Upon creation, two weeks after creation, one month after creation, and every subsequent month thereafter, the samples were imaged. Samples containing the nickel oxide sublayer and those without it (deemed controls) were created and examined synchronously and simultaneously. In doing so, the nucleation and progression of growth of whiskers was recorded.

As a standard, 40 SEM images were captured on each sample every time they were investigated. The magnification used for each sample was held constant at 1 k. Using the scale bar, each image was taken as an area 140 µm by 85 µm, or $1.19 \times 10^{-2}$ mm$^2$. With 40 of these images, this corresponded to a total area of 0.476 mm$^2$. Within this area, all whiskers at least 5 µm in length were recorded as one whisker. Whisker lengths were not preserved except within the original images.

The representative SEM images of NiO-sublayer and control samples and tables/graphs show the whisker populations as function of time (over a total of several months) obtained SEM imaging following the above described protocol.

Copper films on glass substrates were first coated with thin NiO films (with an estimated thickness of 60 nm) and then with 500 nm thick tin (Sn) layers. Samples with and without such NiO sublayers were examined for tin whisker growth by SEM as function of time over a period of more than 4 months.

Sample Set 1 (S1)

Table 2 shows the sample parameters for the substrate, sublayer, tin deposition method and tin thickness.

Table 3 shows the whisker counts through time (# per 0.476 mm$^2$).

TABLE 2

Sample Set 1 (S1) Parameters

| Sample # | Substrate | Sublayer? | Tin Deposition Method | Tin Thickness |
| --- | --- | --- | --- | --- |
| S1.1 | Glass, 300 nm Cu (sputtering) | None | Evaporation | 500 nm |
| S1.2 | Glass, 300 nm Cu (sputtering) | None | Evaporation | 500 nm |
| S1.3 | Glass, 300 nm Cu (sputtering) | Nickel oxide | Evaporation | 500 nm |
| S1.4 | Glass, 300 nm Cu (sputtering) | Nickel oxide | Evaporation | 500 nm |

TABLE 3

| S1 Whisker Counts through Time (# per 0.476 mm²) | | | | |
| --- | --- | --- | --- | --- |
| | S1.1 | S1.2 | S1.3 | S1.4 |
| Initial | 0 | 0 | 0 | 0 |
| 2 Weeks | 24 | 24 | 0 | 0 |
| 4 Weeks | 32 | 24 | 0 | 0 |
| 8 Weeks | 54 | 69 | 0 | 0 |
| 12 Weeks | 90 | 105 | 1 | 0 |
| 16 Weeks | 84 | 105 | 0 | 0 |
| 20 Weeks | 118 | 141 | 0 | 0 |
| 24 Weeks | 163 | 147 | 0 | 0 |
| 28 Weeks | 203 | 187 | 0 | 0 |

Figure 10:
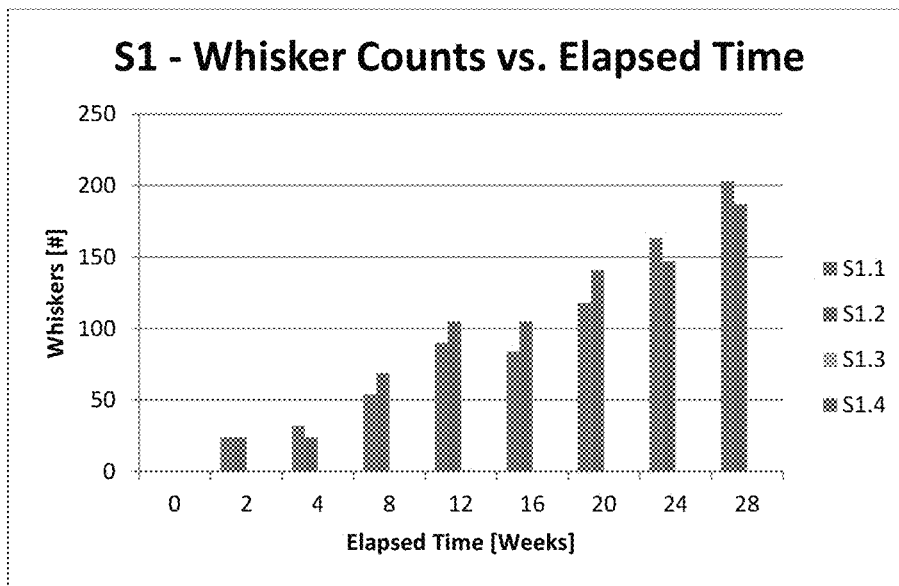
FIG. 10: The number of whiskers found in the sample areas of S1 through time.

FIG. 10 is a graph showing the number of whiskers found in the sample areas of S1 through time.

Figure 11:
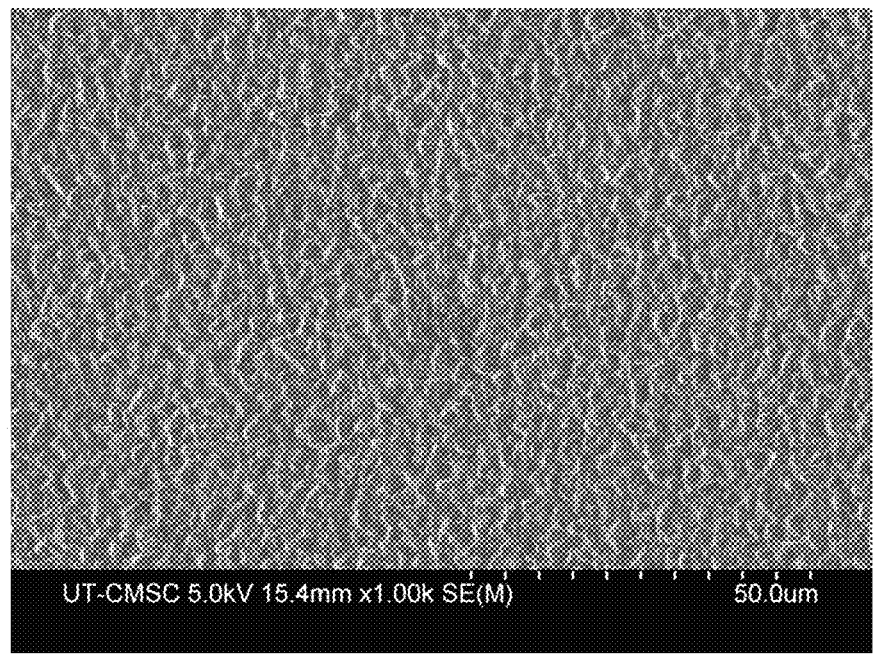
FIG. 11: SEM image of S1.2 (no sublayer) taken during the first week of its creation.

SEM images of were taken over time:

FIG. 11 shows an SEM image of S1.2 (no sublayer) taken during the first week of its creation.

Figure 12:
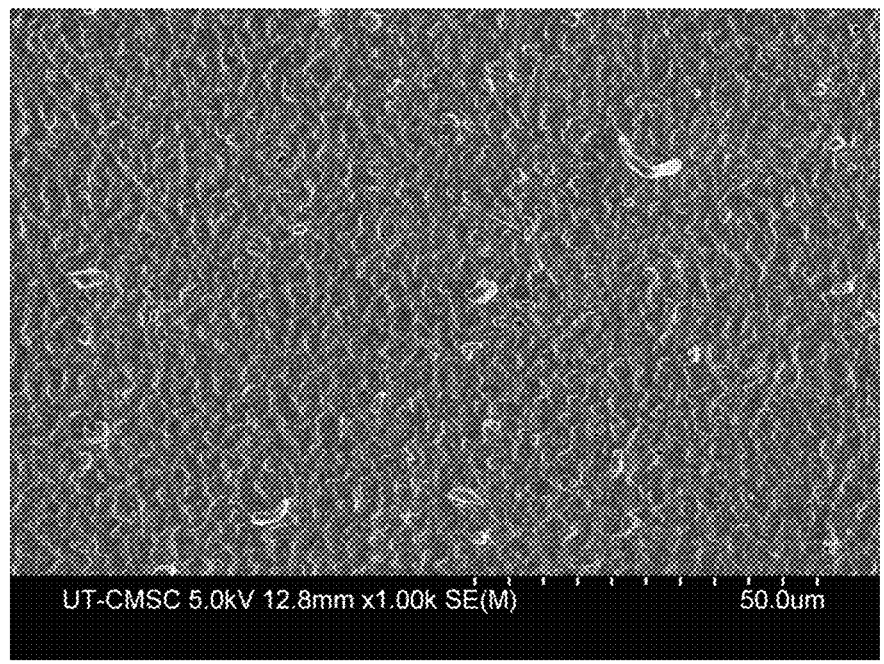
FIG. 12: SEM image of S1.2 (no sublayer) taken three months after creation.

FIG. 12 shows an SEM image of S1.2 (no sublayer) taken three months after creation.

Figure 13:
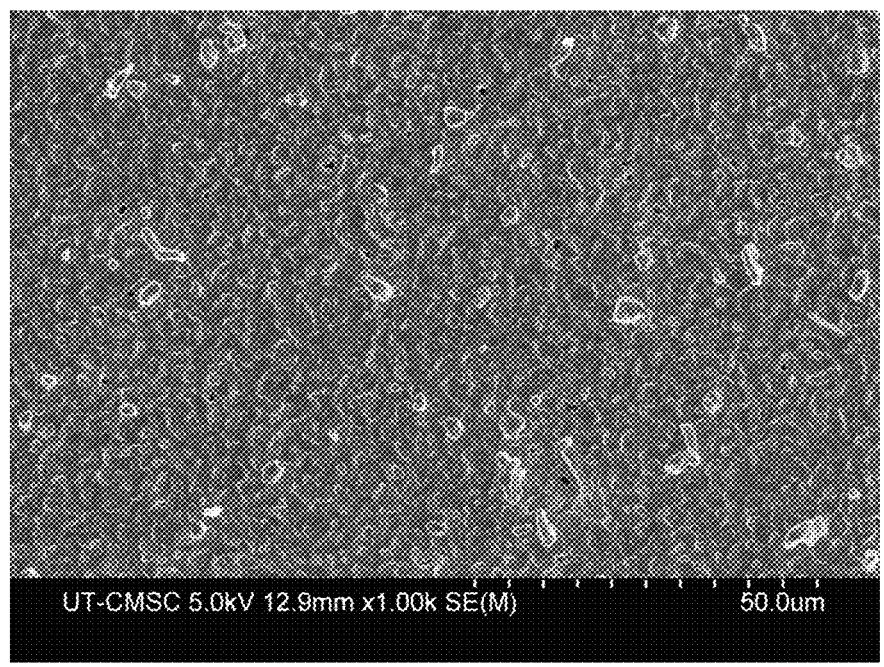
FIG. 13: SEM image of S1.2 (no sublayer) taken seven months after creation.

FIG. 13 shows an SEM image of S1.2 (no sublayer) taken seven months after creation.

Figure 14:
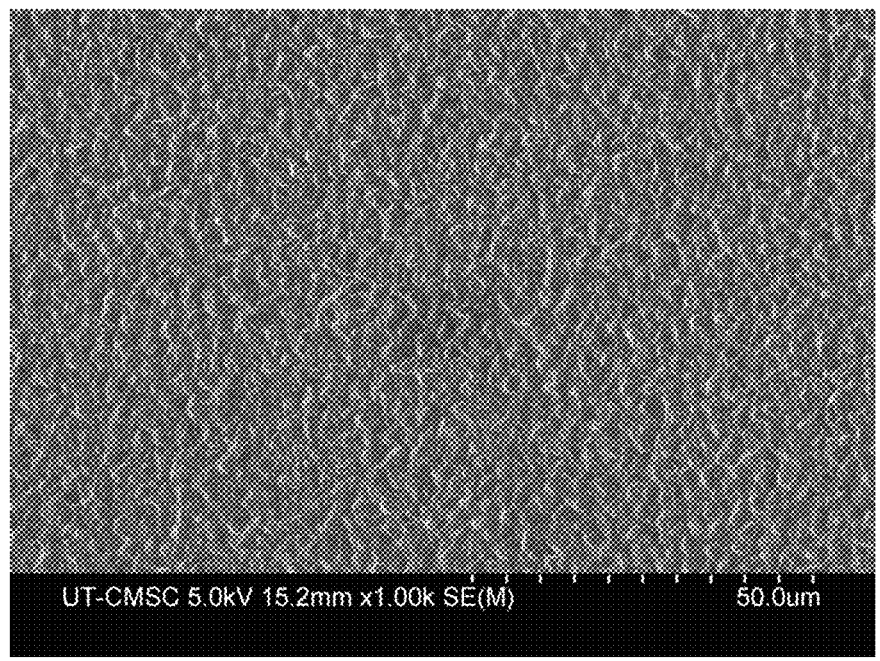
FIG. 14: SEM image of S1.3 (with sublayer) taken during the first week of its creation.

FIG. 14 shows an SEM image of S1.3 (with sublayer) taken during the first week of its creation.

Figure 15:
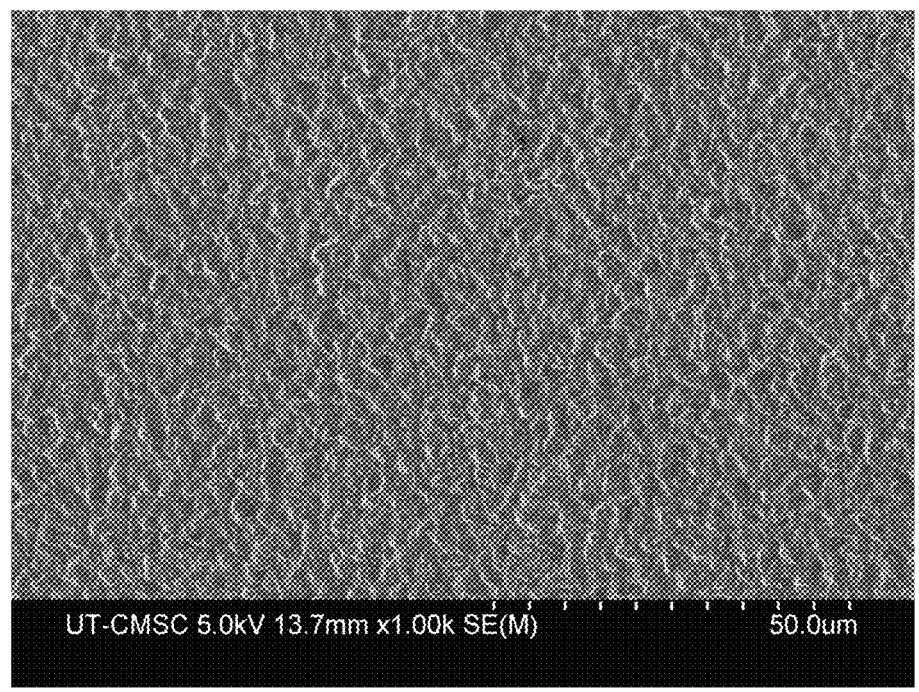
FIG. 15: SEM image of S1.3 (with sublayer) taken three months after creation.

FIG. 15 shows an SEM image of S1.3 (with sublayer) taken three months after creation.

Figure 16:
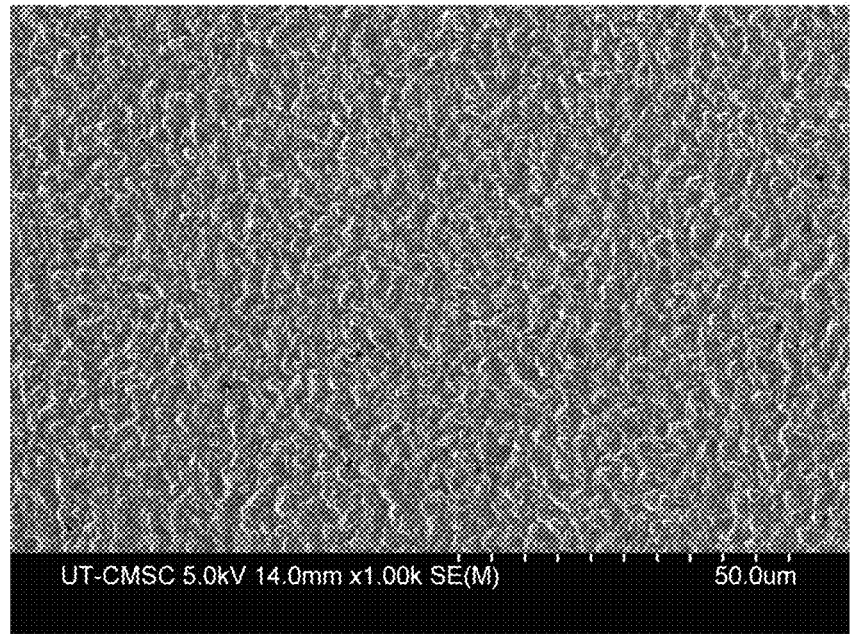
FIG. 16: SEM image of S1.3 (with sublayer) taken seven months after creation.

FIG. 16 shows an SEM image of S1.3 (with sublayer) taken seven months after creation.

Sample Set 2 (S2)

Table 4 shows the sample parameters for the substrate, sublayer, tin deposition method and tin thickness.

Table 5 shows the whisker counts through time (# per 0.476 mm²).

TABLE 4

| Sample Set 2 (S2) Parameters | | | | |
| --- | --- | --- | --- | --- |
| Sample # | Substrate | Sublayer? | Tin Deposition Method | Tin Thickness |
| S2.1 | Glass, 300 nm Cu (sputtering) | None | Evaporation | 500 nm |
| S2.2 | Glass, 300 nm Cu (sputtering) | None | Evaporation | 500 nm |
| S2.3 | Glass, 300 nm Cu (sputtering) | Nickel oxide | Evaporation | 500 nm |
| S2.4 | Glass, 300 nm Cu (sputtering) | Nickel oxide | Evaporation | 500 nm |

TABLE 5

| S2 Whisker Counts through Time (# per 0.476 mm²) | | | | |
| --- | --- | --- | --- | --- |
| | S2.1 | S2.2 | S2.3 | S2.4 |
| Initial | 0 | 1 | 0 | 0 |
| 2 Weeks | 27 | 20 | 0 | 0 |
| 4 Weeks | 42 | 38 | 0 | 0 |
| 8 Weeks | 57 | 48 | 0 | 0 |
| 12 Weeks | 88 | 73 | 0 | 0 |
| 16 Weeks | 83 | 67 | 0 | 0 |

Figure 17:
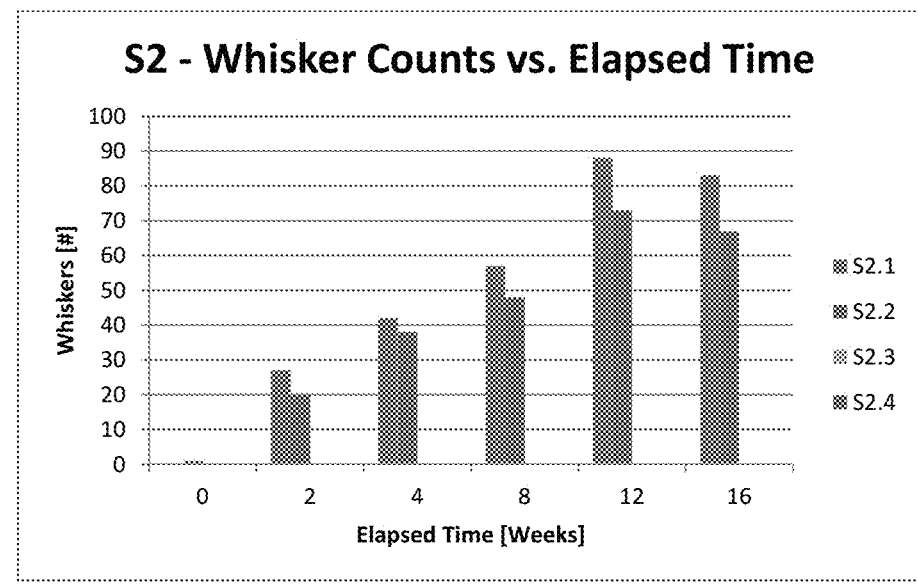
FIG. 17: The number of whiskers found in the sample areas of S2 through time. SEM images of were taken over time.

FIG. 17 is a graph showing the number of whiskers found in the sample areas of S2 through time. SEM images of were taken over time.

Figure 18:
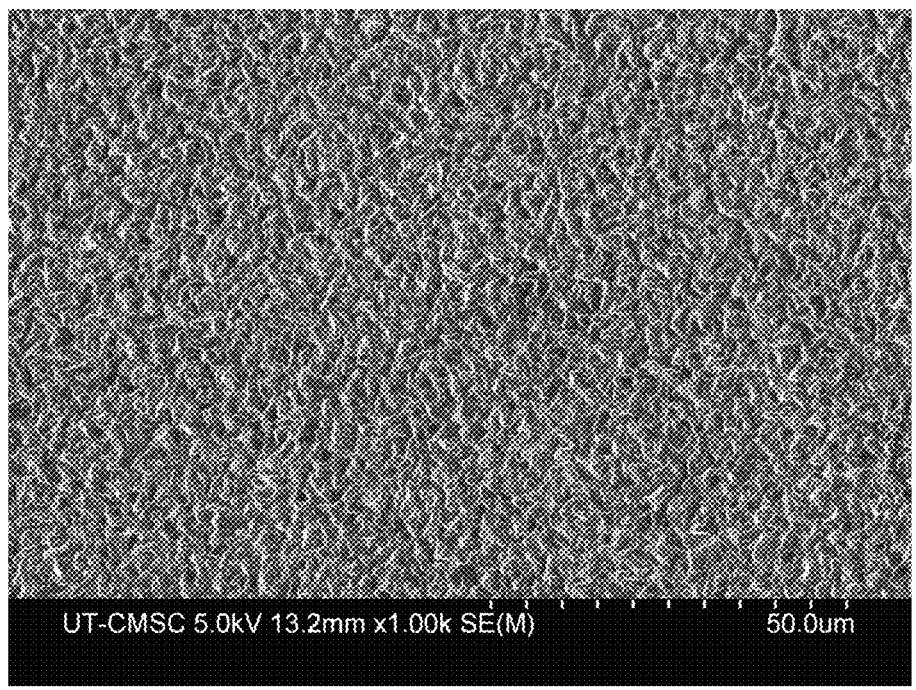
FIG. 18: SEM image of S2.1 (no sublayer) taken during the first week of its creation.

FIG. 18 shows an SEM image of S2.1 (no sublayer) taken during the first week of its creation.

Figure 19:
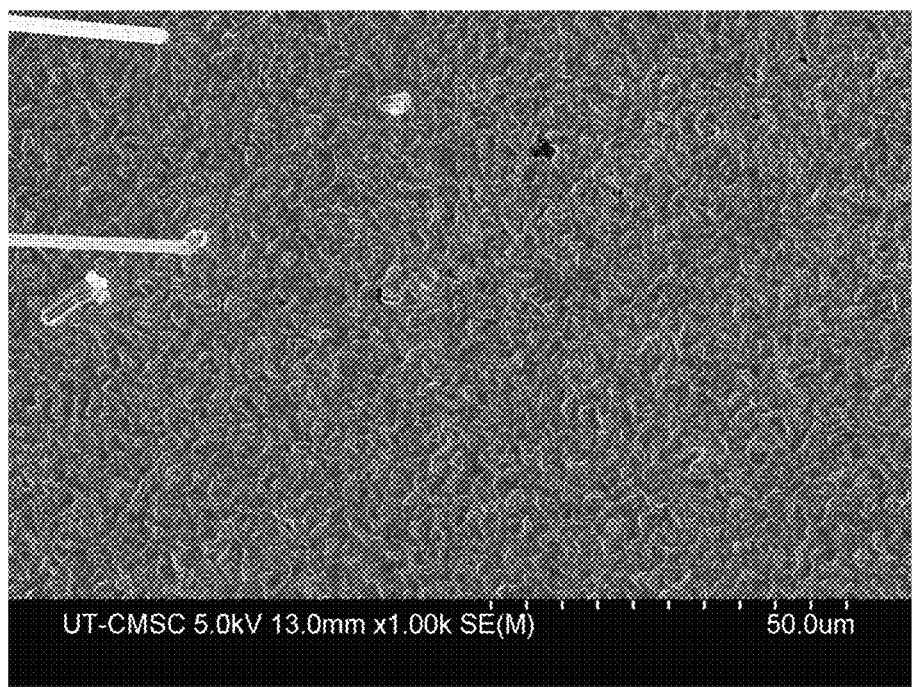
FIG. 19: SEM image of S2.1 (no sublayer) taken two months after creation.

FIG. 19 shows an SEM image of S2.1 (no sublayer) taken two months after creation.

Figure 20:
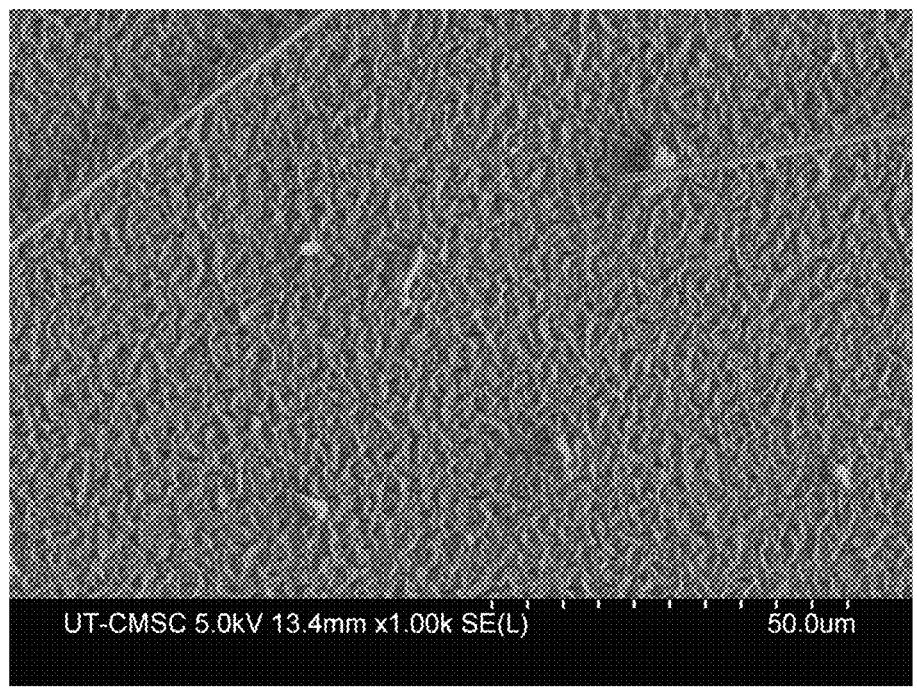
FIG. 20: SEM image of S2.1 (no sublayer) taken four months after creation.

FIG. 20 shows an SEM image of S2.1 (no sublayer) taken four months after creation.

Figure 21:
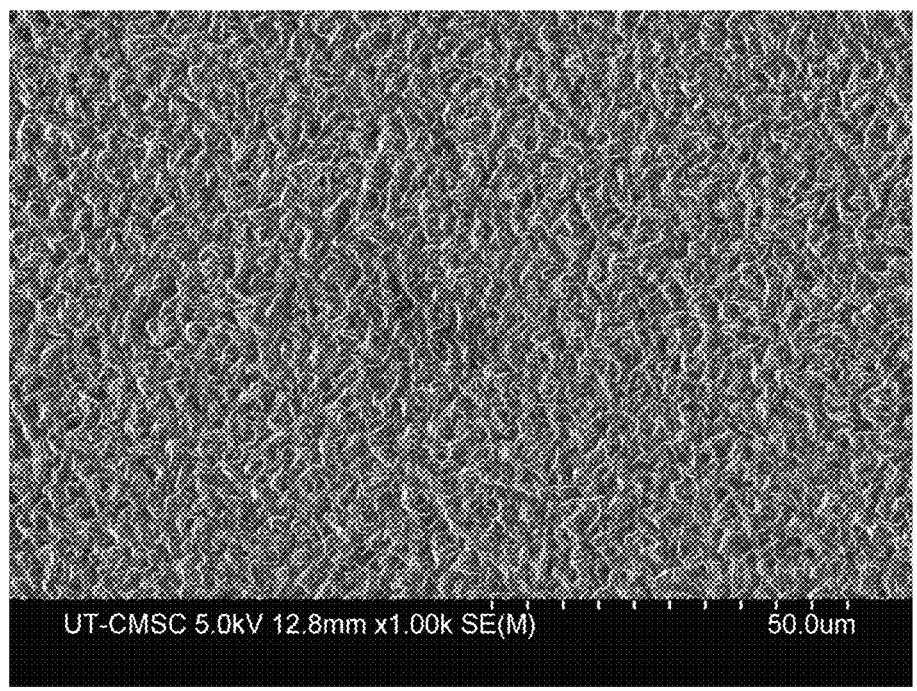
FIG. 21: SEM image of S2.3 (with sublayer) taken during the first week of its creation.

FIG. 21 shows an SEM image of S2.3 (with sublayer) taken during the first week of its creation.

Figure 22:
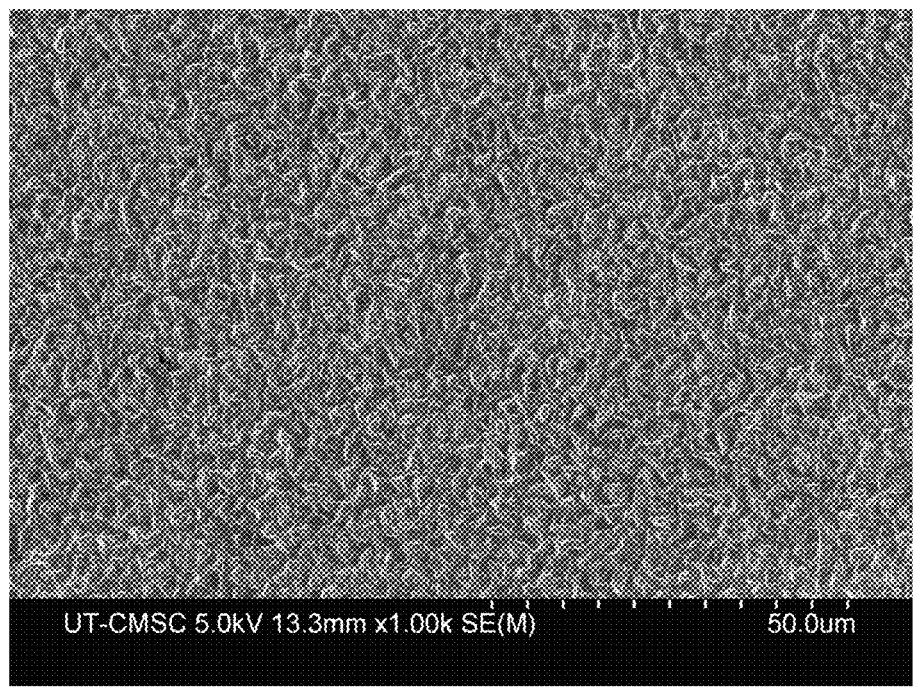
FIG. 22: SEM image of S2.3 (with sublayer) taken two months after creation.

FIG. 22 shows an SEM image of S2.3 (with sublayer) taken two months after creation.

Figure 23:
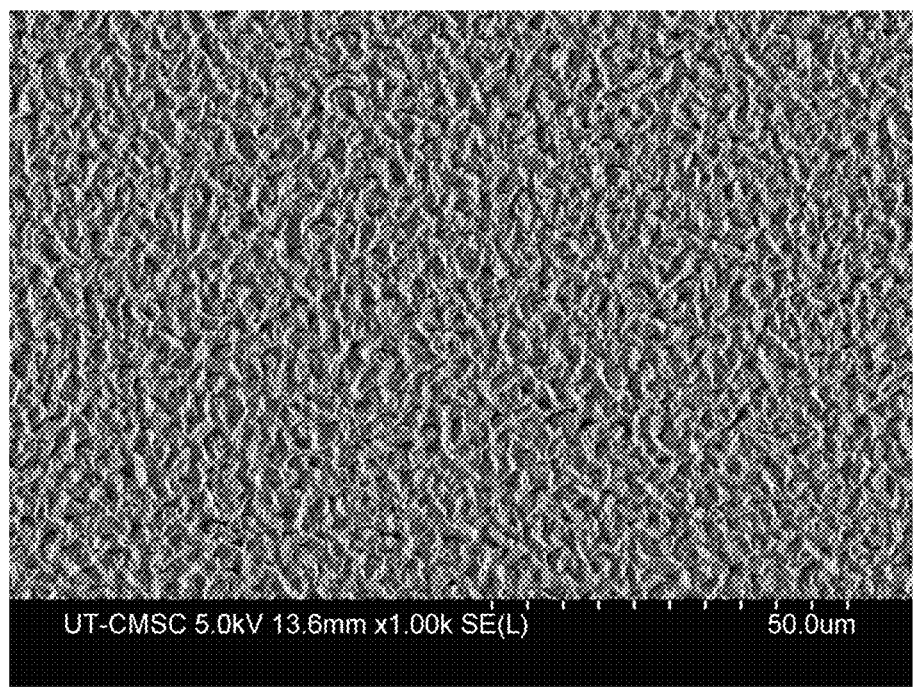
FIG. 23: SEM image of S2.3 (with sublayer) taken four months after creation.

FIG. 23 shows an SEM image of S2.3 (with sublayer) taken four months after creation.

Figure 24:
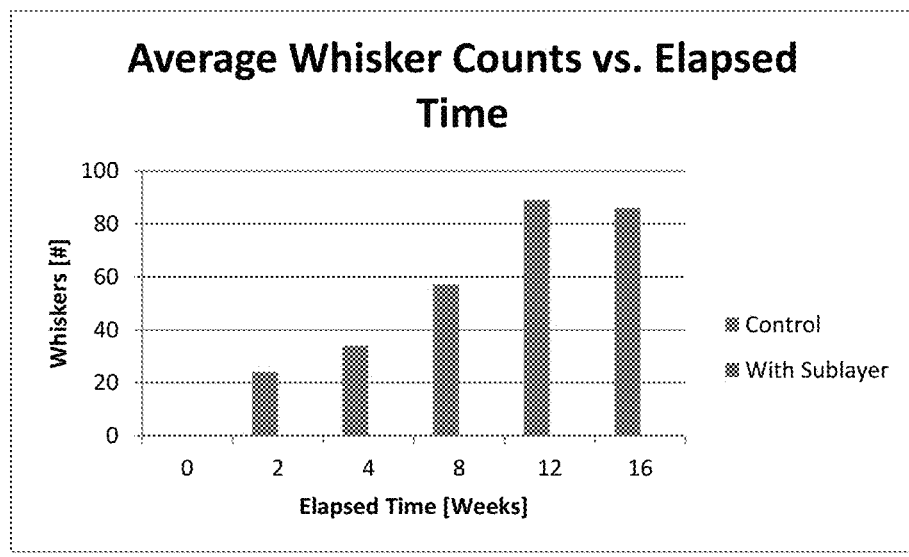
FIG. 24: The average number of whiskers found in the sample areas with and without the sublayer over time.

FIG. 24 is a graph showing the average number of whiskers found in the sample areas with and without the sublayer over time.

The results clearly show that the NiO layers (sub-layers) obtained by a low-cost solution-based method (dip coating) are effective in strongly suppressing or eliminating tin whisker growth. These layers are as effective as the vacuum deposited NiO films (deposited by reactive sputtering of Ni in oxygen containing atmosphere).

Certain embodiments of the devices and methods disclosed herein are defined in the above examples. It should be understood that these examples, while indicating particular embodiments of the invention, are given by way of illustration only. From the above discussion and these examples, one skilled in the art can ascertain the essential characteristics of this disclosure, and without departing from the spirit and scope thereof, can make various changes and modifications to adapt the compositions and methods described herein to various usages and conditions. Various changes may be made and equivalents may be substituted for elements thereof without departing from the essential scope of the disclosure. In addition, many modifications may be made to adapt a particular situation or material to the teachings of the disclosure without departing from the essential scope thereof.

What is claimed is:

1. An electronic device comprising:
a substrate;
a first metal layer on the substrate, wherein the first metal layer is not Ni;
a semiconductor layer comprising NiO directly on the first metal layer; and
a second metal layer directly on the semiconductor layer;
wherein the first metal layer or the second metal layer comprises Sn.

2. The electronic device of claim 1, wherein the semiconductor layer is a uniform, continuous layer.

3. The electronic device of claim 1, wherein the semiconductor layer fully covers a surface of the first metal layer.

4. The electronic device of claim 1, wherein the semiconductor layer consists of NiO.

5. The electronic device of claim 1, wherein the semiconductor layer has a thickness ranging from about 20 nm to about 500 nm.

6. The electronic device of claim 1, wherein the semiconductor layer has a thickness ranging from about 50 nm to about 200 nm.

7. The electronic device of claim 1, wherein the semiconductor layer has a thickness of about 100 nm.

8. The electronic device of claim 1, wherein the first metal layer or the second metal layer comprises Cu.

9. The electronic device of claim 1, wherein the first metal layer or the second metal layer comprises Zn.

10. The electronic device of claim 1, wherein the first metal layer or the second metal layer comprises Cd, Al, Au, or Ag.

11. The electronic device of claim 1, wherein the second metal layer is substantially free of whiskers.

12. The electronic device of claim 1, wherein the electronic device is a printed circuit board or an integrated circuit.

13. The electronic device of claim 1, wherein the substrate comprises glass, silicon, or plastic.

14. The electronic device of claim 1, wherein the NiO comprises a dopant.

15. An electronic device comprising:
a substrate comprising glass, silicon, or plastic;
a semiconductor layer comprising NiO directly on the substrate; and
a metal layer comprising Sn directly on the semiconductor layer.

16. The electronic device of claim 15, wherein the semiconductor layer is a uniform, continuous layer.

17. The electronic device of claim 15, wherein the semiconductor layer fully covers a surface of the substrate.

18. The electronic device of claim 15, wherein the semiconductor layer consists of NiO.

19. The electronic device of claim 15, wherein the semiconductor layer has a thickness ranging from about 20 nm to about 500 nm.

20. The electronic device of claim 15, wherein the semiconductor layer has a thickness ranging from about 50 nm to about 200 nm.

21. The electronic device of claim 15, wherein the semiconductor layer has a thickness of about 100 nm.

22. The electronic device of claim 15, wherein the metal layer is substantially free of whiskers.

23. The electronic device of claim 15, wherein the electronic device is a printed circuit board or an integrated circuit.

24. The electronic device of claim 15, wherein the NiO comprises a dopant.

25. An electronic device comprising:
a substrate;
a first metal layer on the substrate wherein the first metal layer is not Ni;
a semiconductor layer comprising NiO directly on the first metal layer; and
a second metal layer on the semiconductor layer;
wherein the first metal layer or the second metal layer consists of Sn.

26. An electronic device comprising:
a substrate comprising silicon or plastic;
a semiconductor layer comprising NiO directly on the substrate; and
a metal layer comprising Sn directly on the semiconductor layer.

* * * * *